(12) United States Patent
Ichiyama et al.

(10) Patent No.: US 7,778,319 B2
(45) Date of Patent: *Aug. 17, 2010

(54) JITTER MEASURING APPARATUS, JITTER MEASURING METHOD AND TEST APPARATUS

(75) Inventors: Kiyotaka Ichiyama, Tokyo (JP); Masahiro Ishida, Tokyo (JP); Yasuhide Kuramochi, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 1314 days.

This patent is subject to a terminal disclaimer.

(21) Appl. No.: 11/266,472

(22) Filed: Nov. 4, 2005

(65) Prior Publication Data

US 2007/0104260 A1 May 10, 2007

(51) Int. Cl.
*H04B 3/46* (2006.01)
(52) U.S. Cl. .................. 375/226; 375/224; 375/376; 370/516; 702/69; 702/111
(58) Field of Classification Search ............. 375/226, 375/224, 371, 357, 376; 702/69, 111; 370/497, 370/516
See application file for complete search history.

(56) References Cited

U.S. PATENT DOCUMENTS 5,754,437 A * 5/1998 Blazo .......................... 702/75
6,259,755 B1 * 7/2001 O'Sullivan et al. .......... 375/376
6,598,004 B1 * 7/2003 Ishida et al. .................. 702/69
7,236,555 B2 * 6/2007 Brewer ....................... 375/357
7,496,137 B2 * 2/2009 Ichiyama et al. ............ 375/226
2002/0136337 A1 * 9/2002 Chatterjee et al. ........... 375/355
2004/0066871 A1 * 4/2004 Cranford et al. ............. 375/371
2006/0182170 A1 * 8/2006 Ichiyama et al. ............ 375/226

* cited by examiner

*Primary Examiner*—Mohammad H Ghayour
*Assistant Examiner*—Eboni Giles
(74) *Attorney, Agent, or Firm*—Sterne, Kessler, Goldstein & Fox P.L.L.C.

(57) ABSTRACT

There is provided a jitter measuring apparatus for measuring jitter in a signal-under-measurement having a first pulse generator for detecting edges of the data-signal-under-measurement to output a first pulse signal having a pulse width set in advance corresponding to the edge, a second pulse generator for detecting boundaries of data sections where data values do not change in the data-signal-under-measurement to output a second pulse signal having a pulse width set in advance corresponding to timing of the detected boundaries of the data sections, a filter for removing carrier frequency components of said data-signal-under-measurement from first and second pulse signals and a jitter calculating section for calculating timing jitter in the data-signal-under-measurement based on the first and second pulse signals.

13 Claims, 21 Drawing Sheets

JITTER MEASURING APPARATUS, JITTER MEASURING METHOD AND TEST APPARATUS

BACKGROUND OF THE INVENTION

1. Field of the Invention

The present invention relates to a jitter measuring apparatus and a measuring method for measuring jitter in a signal-under-measurement and a test apparatus for testing a device-under-test.

2. Related Art

Conventionally, as a method for measuring jitter in a signal-under-measurement, there has been known a method of comparing phase of the signal-under-measurement with phase of the signal-under-measurement delayed by one period for example (T. Yamaguchi, "A Real-Time Jitter Measurement Board for High Performance Computer and Communication System", ITC 2004). Period jitter in the signal-under-measurement may be measured by delaying the signal-under-measurement by one period and by comparing phases of neighboring rising edges in the signal-under-measurement.

According to this method, the signal-under-measurement and the delayed signal-under-measurement are applied to a phase comparator so as to output a voltage signal corresponding to a value of the period jitter in each cycle. Timing jitter in the signal-under-measurement may be also measured on real-time by integrating the voltage signal outputted out of the phase comparator by using an integrator or the like.

However, the conventional jitter measuring method has required to delay the signal-under-measurement accurately. For example, it is necessary to delay the signal-under-measurement by one period accurately in measuring the period jitter in the signal-under-measurement. However, if there is an error in the delay time, the value of the period jitter detected by the phase comparator becomes a value into which the actual period jitter is added by the delayed error as an offset. Still more, the measured error is accumulated by the integrator and timing jitter outputted out of the integrator saturates soon or later.

Accordingly, the conventional jitter measuring method has required a delay circuit that generates accurate delay time. However, it has been difficult to produce an accurate delay circuit and it has been difficult to measure jitter in the signal-under-measurement accurately by the conventional jitter measuring method because the delay error is influential in the jitter measuring error.

Still more, the phase of the signal-under-measurement is also compared with phase of the delayed signal in the conventional jitter measuring method. Therefore, when jitter amplitude in the signal-under-measurement is greater than one period of the signal-under-measurement, there has been a possibility that phases of edges being non-corresponding to each other are compared and hence the jitter could not be accurately measured.

It was also unable to accurately measure timing jitter in a signal in which logical values appear randomly such as a data signal by the conventional jitter measuring method. For example, it is necessary to generate a triggering signal for measuring phase of edges of the data signal-under measurement in measuring timing jitter by using one of conventional methods, i.e. by using a sampling oscilloscope, a digital oscilloscope and the like. However, because position of the edges is irregular in the data signal, it is necessary to generate triggering signals of various timing. Therefore, timing jitter of the triggering signals themselves becomes large, worsening the accuracy in measuring jitter in the data-signal-under-measurement.

A measuring cost also increases to generate triggering signals having small timing jitter because a high precision circuit is required.

Therefore, it was unable to measure timing jitter in the data signal whose pattern is irregular at low cost and accurately by the conventional measuring methods. Still more, neither method nor circuit for measuring jitter in the data signal on real-time has been invented yet.

Accordingly, it is an object of the invention to provide a jitter measuring apparatus, a jitter measuring method and a test apparatus that are capable of solving the above-mentioned problems. This object may be achieved through the combination of features described in independent claims of the invention. Dependent claims thereof specify preferable embodiments of the invention.

SUMMARY OF THE INVENTION

In order to solve the above-mentioned problem, according to a first aspect of the invention, there is provided a jitter measuring apparatus for measuring jitter in a signal-under-measurement, having a first pulse generator for detecting edges of the data-signal-under-measurement to output a first pulse signal having a pulse width set in advance corresponding to the edges, a second pulse generator for detecting boundaries of data sections where data values do not change in the data-signal-under-measurement to output a second pulse signal having a pulse width set in advance corresponding to timing of the boundaries of the detected data sections, a filter for removing carrier frequency components of the data-signal-under-measurement from the first and second pulses and a jitter calculator for calculating jitter in the signal-under-measurement based on the signals outputted out of the filter.

The jitter measuring apparatus may further include a complementary data signal generating section for generating a complementary data signal having edges at every boundary of the data sections of the data-signal-under-measurement over which the data values of the data-signal-under-measurement do not change, and the second pulse generator may output the second pulse signal corresponding to the edge of the complementary data signal.

The complementary data signal generating section may generate the complementary data signal by which the edges of the data-signal-under-measurement and of the complementary data signal are arranged at almost equal intervals when they are aligned in the same time axis.

The filter may be a low pass filter that passes components lower than predetermined cut-off frequency smaller than carrier frequency of the data-signal-under-measurement among frequency components of the pulse signal.

The jitter calculator may calculate period jitter in the data-signal-under-measurement based on a signal outputted out of the filter.

The jitter measuring apparatus may further include a level shifting circuit for outputting the first and second pulse signals outputted out of the first and second pulse generators to the filter by shifting their signal level to signal level corresponding to characteristics of the filter.

The jitter measuring apparatus may further include an integrator for integrating the signal outputted out of the filter.

The jitter calculator may calculate timing jitter in the data-signal-under-measurement based on the signal obtained by integrating by the integrator.

The jitter measuring apparatus may further include a level shifting circuit for inputting the signal outputted out of the filter to the integrator by shifting its signal level to signal level corresponding to characteristics of the integrator.

According to a second aspect of the invention, there is provided a jitter measuring method for measuring jitter in a data-signal-under-measurement, having a first pulse generating step of detecting edges of the data-signal-under-measurement to output a first pulse signal having a pulse width set in advance corresponding to the edges, a second pulse generating step of detecting boundaries of data sections where data values do not change in the data-signal-under-measurement to output a second pulse signal having a pulse width set in advance corresponding to timing of the boundary of the detected data sections, a filtering step of removing carrier frequency components of the data-signal-under-measurement from the first and second pulse signals and a jitter calculating step of calculating timing jitter in the data-signal-under-measurement based on the pulse signals outputted in the filtering step.

According to a third aspect of the invention, there is provided a test apparatus for testing a device-under-test, having a jitter measuring apparatus for measuring jitter in a signal-under-measurement outputted out of the device-under-test and a judging section for judging whether or not the device-under-test is defect-free based on jitter in the signal-under-measurement measured by the jitter measuring apparatus, wherein the jitter measuring apparatus has a first pulse generator for detecting edges of the data-signal-under-measurement to output a first pulse signal having a pulse width set in advance corresponding to the edge, a second pulse generator for detecting boundaries of data sections where data values do not change in the data-signal-under-measurement to output a second pulse signal having a pulse width set in advance corresponding to timing of the boundaries of the detected data sections, a filter for removing carrier frequency components of the data-signal-under-measurement from first and second pulse signals and a jitter calculating section for calculating timing jitter in the data-signal-under-measurement based on the first and second pulse signals.

According to a fourth aspect of the invention, there is provided an electronic device, having an internal circuit for outputting a data signal and a jitter measuring circuit for measuring jitter in the data signal outputted out of the internal circuit, wherein the jitter measuring circuit comprises a pulse generator for outputting a pulse signal having a predetermined pulse width corresponding to edges-under-measurement for measuring the jitter in the data signal and a filter for removing carrier frequency components of the data signal from the pulse signal.

The jitter measuring circuit may further have a jitter calculator for calculating jitter in the data based on the signal outputted out of the filter. It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
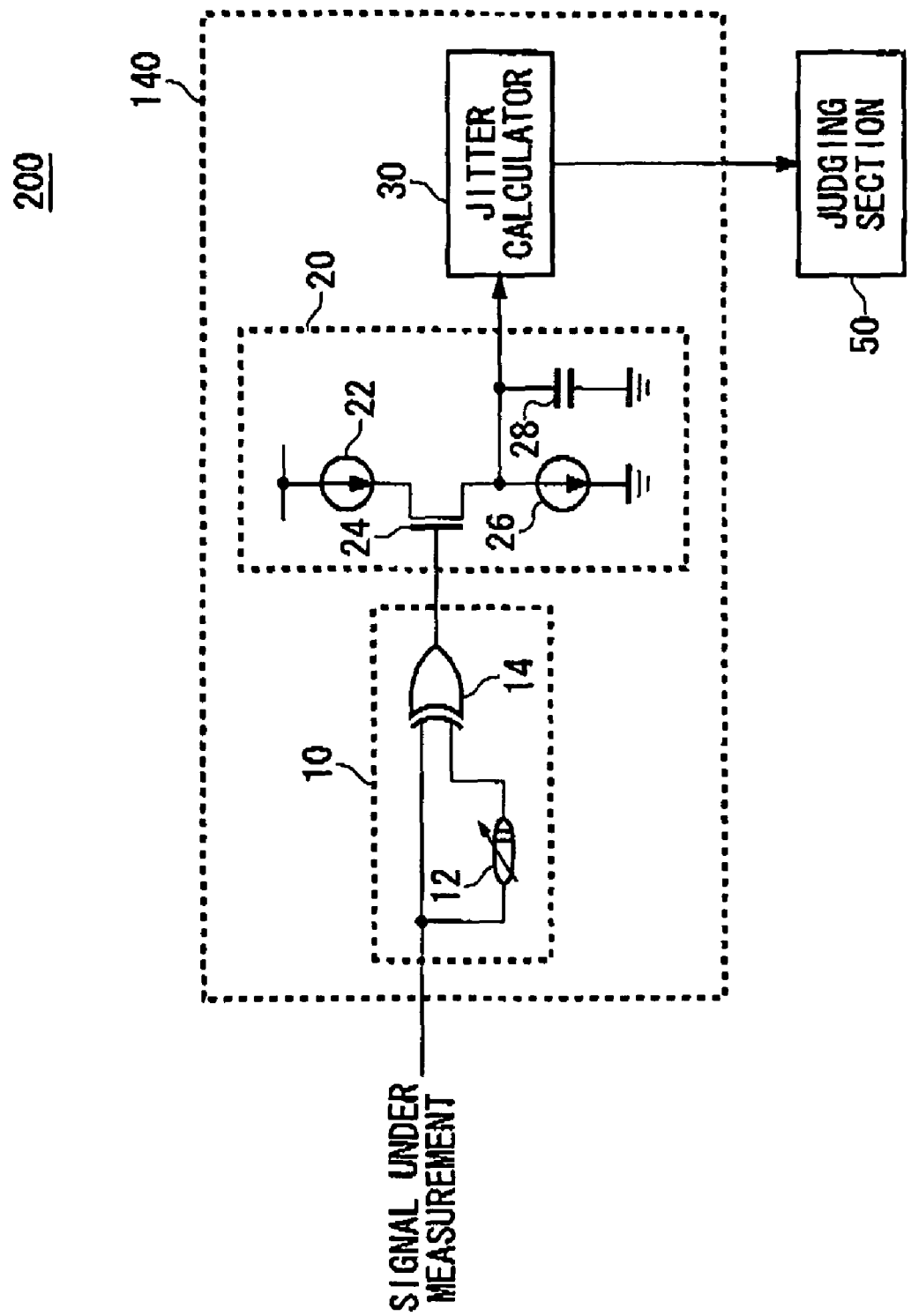
FIG. 1 is a diagram showing one exemplary configuration of a test apparatus for testing a device-under-test.

FIG. 1 is a diagram showing one exemplary configuration of a test apparatus 200 for testing a device-under-test. The test apparatus 200 is an apparatus for judging whether or not a device-under-test is defect-free based on jitter in a signal-under-measurement outputted out of the device-under-test and is provided with a jitter measuring apparatus 140 and a judging section 50. The signal-under-measurement is a clock signal having a preset period for example.

The jitter measuring apparatus 140 is an apparatus for measuring timing jitter in the signal-under-measurement. Based on the timing jitter measured by the jitter measuring apparatus 140, the judging section 50 judges whether or not the device-under-test is defect-free. For instance, the judging section 50 judges whether or not the device-under-test is defect-free based on whether or not a timing jitter value measured by the jitter measuring apparatus 140 is greater than a preset reference value.

The jitter measuring apparatus 140 has a pulse generator 10, an integrator 20 and a jitter calculator 30. The pulse generator 10 receives a signal-under-measurement and outputs a pulse signal having a preset pulse width corresponding to edges-under-measured from which the timing jitter is to be measured in the signal-under-measurement.

In measuring the timing jitter in each edge of the signal-under-measurement for instance, the pulse generator 10 outputs a pulse signal having a preset pulse width corresponding to all edges of the signal-under-measurement. In this case, the pulse generator 10 may have a delay circuit 12 and an exclusive OR gate 14 as shown in FIG. 1. The delay circuit 12 outputs the signal-under-measurement by delaying by a certain value of delay. Then, the exclusive OR gate 14 outputs an exclusive OR of the signal-under-measurement and the delay signal outputted out of the delay circuit 12. Such configuration allows the pulse signal having the pulse width determined by the value of delay in the delay circuit 12 corresponding to all of the edges of the signal-under-measurement. Here, it is sufficient for the delay circuit 12 $$ to be able to generate a constant delay continuously within a measuring period and an actual delay time may have an error from a preset delay value.

Still more, the pulse generator 10 may output the pulse signal corresponding either to the rising or to the falling edge of the signal-under-measurement. In this case, period jitter between the rising edges and between the falling edges may be readily measured. Still more, the pulse generator 10 has a circuit configuration different from what shown in FIG. 1 in this case. It is readily possible to realize the generation of the pulse signal corresponding to rising edges or falling edges of the signal-under-measurement by adequately modifying the circuit configuration of the pulse generator 10. A case when the pulse generator 10 generates the pulse signal corresponding to the entire edges of the signal-under-measurement will be explained hereinafter.

The jitter calculator 30 calculates the timing jitter in the signal-under-measurement based on the result of integration of the pulse signal integrated by the integrator 20. The integrator 20 outputs a jitter measuring signal of triangular wave obtained by integrating the pulse signal outputted out of the pulse generator 10. In this example, the integrator 20 outputs a jitter measuring signal whose signal level increases at a predetermined rate of increment during when the signal outputted out of the pulse generator 10 indicates logic H and whose signal level decreases at a predetermined rate of decrement during when the signal outputted out of the pulse generator 10 indicates logic L.

The integrator 20 has a current source 22, a current sink 26, a capacitor 28 and a charge/discharge control section 24 in this example.

The current source 22 generates a source current specifying the rate of increment of the jitter measuring signal and the current sink 26 generates a sink current specifying the rate of decrement of the jitter measuring signal. The capacitor 28 generates voltage level of the jitter measuring signal by being charged/discharged by the current source 52 and the current sink 56. Still more, the charge/discharge control section 24 charges the capacitor based on the source current during when the pulse signal indicates the logic value H and discharges the capacitor based on a current obtained by subtracting the sink current from the current source during when the pulse signal indicates the logic value H.

Figure 2:
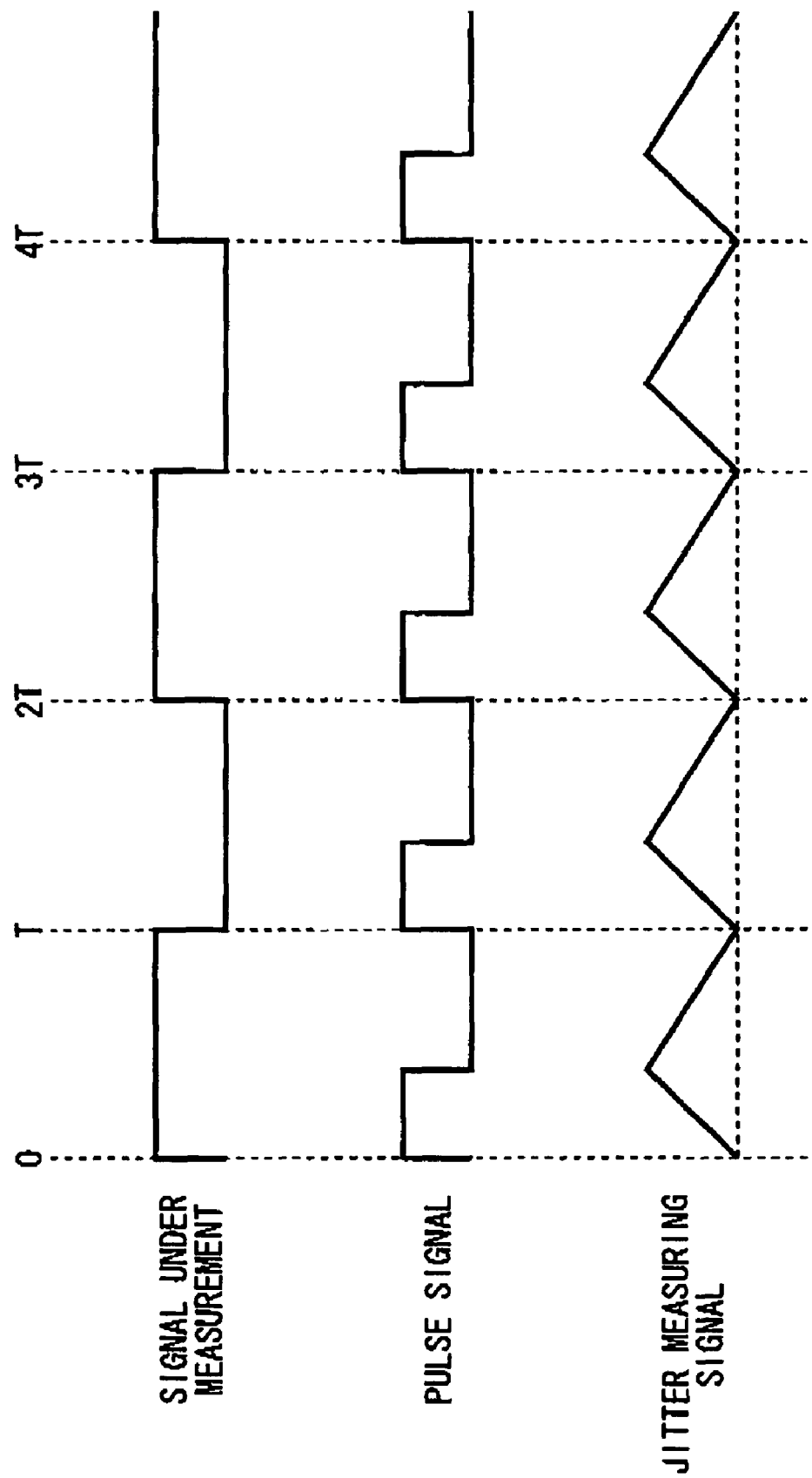
FIG. 2 is a chart showing one exemplary waveform of a jitter measuring signal outputted out of an integrator when a signal-under-measurement is jitter-free (jitter of a rising clock edge is zero).

FIG. 2 shows one exemplary waveform of the jitter measuring signal outputted out of the integrator 20 when the signal-under-measurement is jitter-free. When the signal-under-measurement is timing jitter-free, timing of the respective edges of the signal-under-measurement coincide with multiples of half-periods (0, T, 2T, . . . ) of the signal-under-measurement. The pulse generator 10 generates a pulse signal having a predetermined pulse width corresponding to the respective edges. Therefore, the duty ratio of respective cycles of the signal outputted out of the pulse generator 10 becomes a constant value.

Then, the integrator 20 outputs the jitter measuring signal of triangular wave as described above. When the signal-under-measurement is timing jitter-free, the integrator 20 generates the jitter measuring signal with the rates of increment and decrement by which the respective extreme values of the jitter measuring signal become signal levels set in advance. Therefore, when the signal-under-measurement is timing jitter-free, the maximum and minimum values of the jitter measuring signal show constant levels, respectively.

Figure 3:
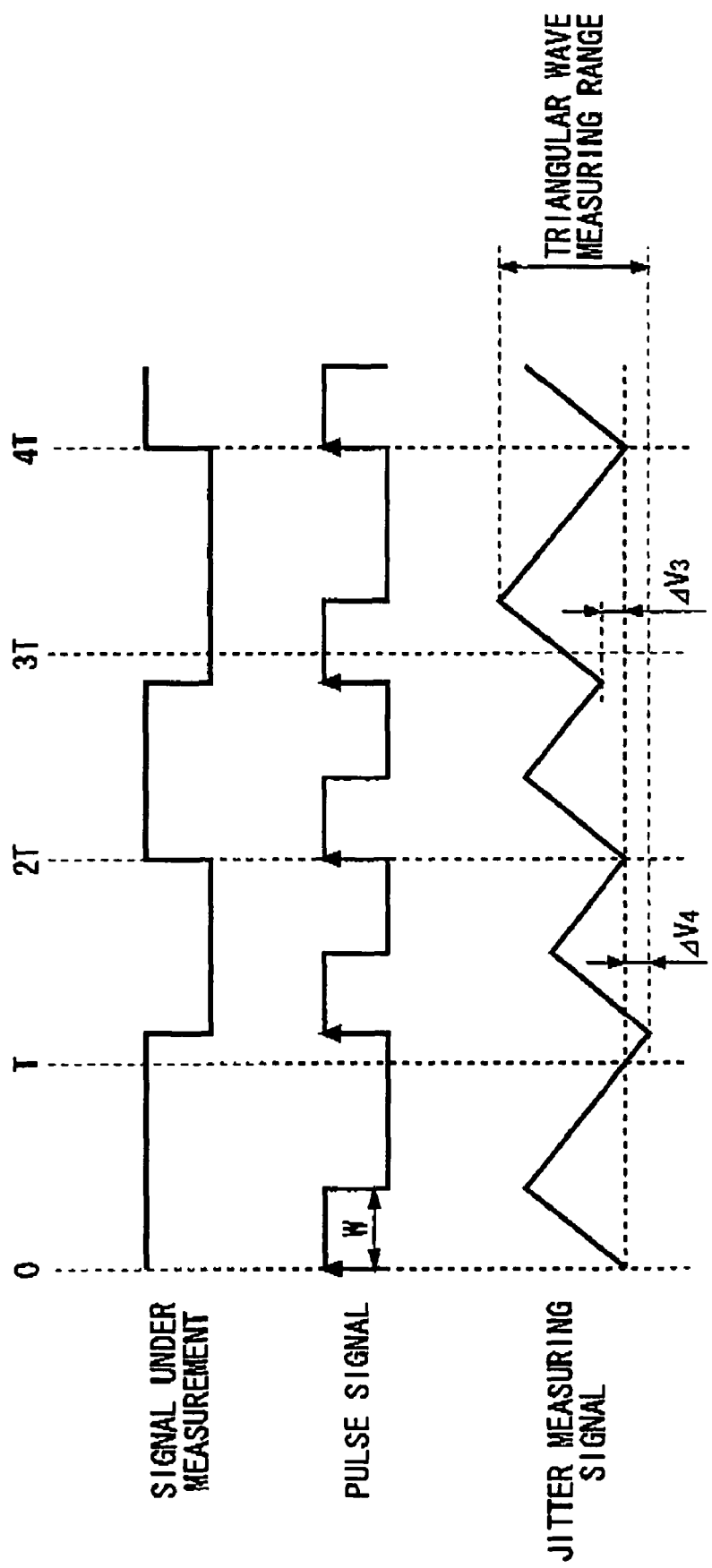
FIG. 3 is a chart showing one exemplary waveform of a jitter measuring signal outputted out of the integrator when the data-signal-under-measurement is jittering (jitter of the rising clock edge is non-zero).

FIG. 3 is a chart showing one exemplary waveform of the jitter measuring signal outputted out of the integrator 20 when the signal-under-measurement is jittering. When the signal-under-measurement is jittering in its timing, timing of edges of the signal-under-measurement do not coincide with multiples of the half period (0, T, 2T, . . . ) of the signal-under-measurement and the duty ratio of the respective cycles of the signal outputted out of the pulse generator 10 does not become a constant value.

Therefore, the extreme values of the jitter measuring signal outputted out of the integrator 20 do not show the predetermined values as illustrated in FIG. 3. A level difference ($\Delta V1$, . . . , $\Delta V3$, . . . ) between the predetermined value and the extreme value in the amplitude change of the jitter measuring signal is proportional to a jitter value in the edges of the signal-under-measurement corresponding to the extreme value.

The timing jitter in the signal-under-measurement may be readily calculated based on this level difference. Still more, even if a delay error occurs from the delay preset value in the delay circuit 12, the timing jitter in the signal-under-measurement may be measured without being influenced by the delay error as far as the delay circuit 12 generates the constant delay.

However, the jitter measuring signal outputted out of the integrator 20 contains the component of the triangular wave in addition to the jitter component. Therefore, the integrator 20 is required to have an output range through which it can output the signal in which the triangular wave component is added to the jitter component. Still more, the jitter calculator 30 is required to have a measuring range through which it can measure the signal in which the triangular wave component is added to the jitter component. Therefore, there is a case when the jitter measuring apparatus 140 in this example is unable to measure very small jitter because a signal-to-noise ratio becomes small in the measurement of jitter.

Figure 4:
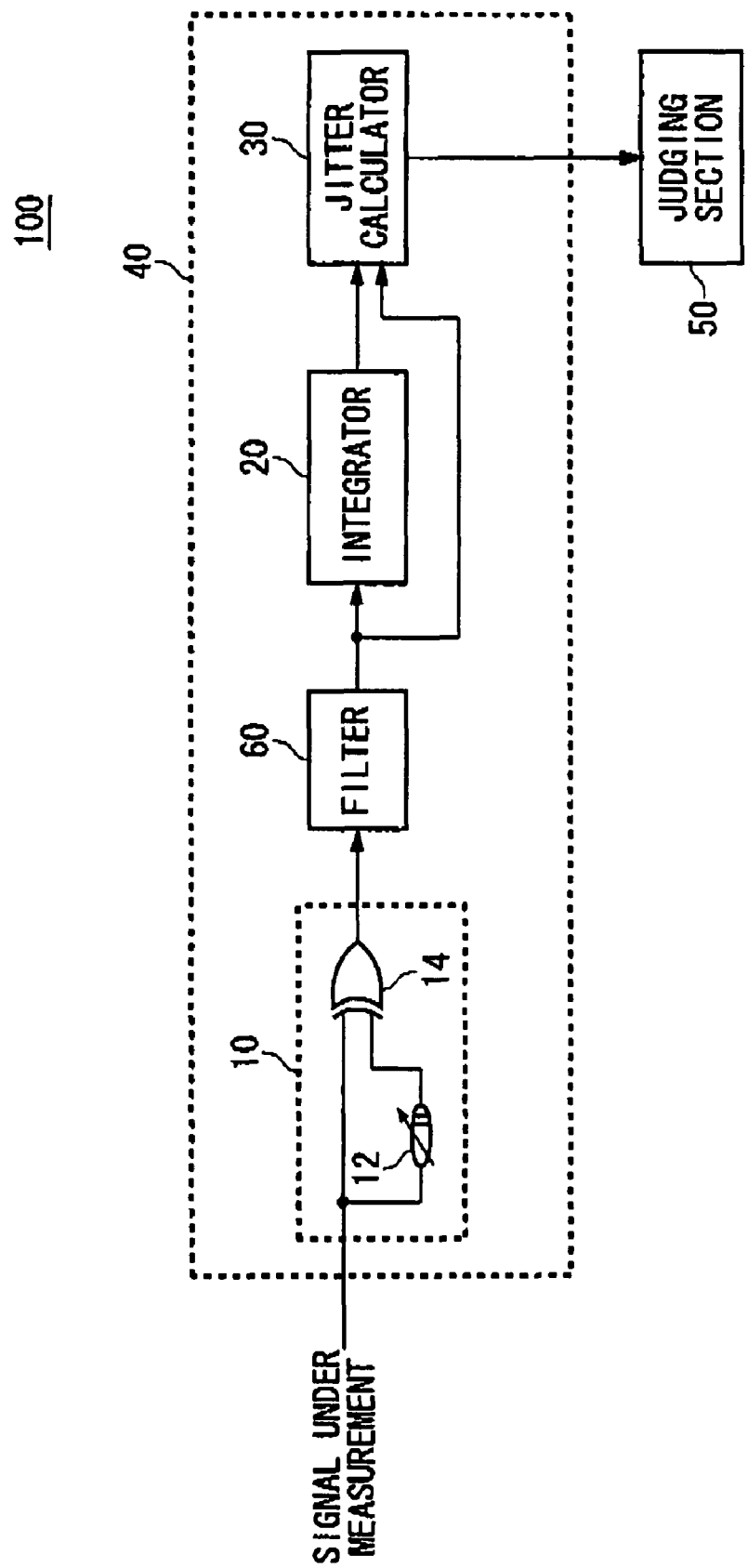
FIG. 4 is a diagram showing one exemplary configuration of the test apparatus according to an embodiment of the invention.

FIG. 4 is a diagram showing one exemplary configuration of the test apparatus 100 according to one embodiment of the invention. The test apparatus 100 of this embodiment has a jitter measuring apparatus 40 and the judging section 50. The judging section 50 is the same with the judging section 50 explained in FIG. 1, so that its explanation will be omitted here.

The jitter measuring apparatus 40 has the pulse generator 10, a filter 60, the integrator 20 and the jitter calculator 30. The pulse generator 10 is the same with the pulse generator 10 explained in FIG. 1, so that its explanation will be omitted here.

The filter 60 removes carrier frequency components of the signal-under-measurement from the pulse signal outputted out of the pulse generator 10. The term used here, i.e., the carrier frequency components of the signal-under-measurement, includes components of higher-order harmonics of the carrier frequency component.

The filter 60 may be a low pass filter that passes from a component whose frequency is zero to a component of predetermined frequency which is smaller than the carrier frequency of the signal-under-measurement among the frequency components of the pulse signal. A cut-off frequency in the filter 60 is preferable to be larger than frequency of a jitter component contained in the signal-under-measurement.

When the carrier frequency of the signal-under-measurement is 1 GHz and the frequency of the jitter component is 1 MHz for example, the cut-off frequency of the filter 60 is preferable to be sufficiently larger than 1 MHz and to be sufficiently smaller than 1 GHz. For example, the cut-off frequency of the filter 60 may be 400 MHz.

The integrator 20 integrates the signal outputted out of the filter 60. The integrator 20 may have the same configuration with the integrator 20 shown in FIG. 1. The integrator 20 may be also an integrating circuit using a voltage-to-current converter (trans=conductance amplifier) and a capacitor. The voltage-to-current converter converts a voltage signal outputted out of the filter 60 into a current signal. The capacitor outputs a voltage value obtained by integrating the current signal by being charged/discharged by the current signal. When a voltage-to-current conversion ratio of the voltage-to-current converter is K [A/V] and a capacity of the capacitor is C [F], an integral coefficient of the integrator 20 may be expressed as K/C. The voltage-to-current converter may be a charging pump.

The integrator 20 may also have an amplifying circuit for amplifying and outputting the integrated value in a predetermined dynamic range. In this example, the carrier frequency components of the signal to be applied to the integrator 20 have been removed by the filter 60. Therefore, the integrator 20 outputs only the jitter component, allowing the jitter output having a high signal-to-noise ratio to be obtained as compared to the integrator 20 explained in connection with FIG. 1.

The jitter calculator 30 measures the jitter in the signal-under-measurement based on the signal outputted out of the filter 60 or the integrator 20. In measuring jitter in the signal-under-measurement based on the signal outputted out of the integrator 20 for example, it can measure the timing jitter in the signal-under-measurement in the same manner with the jitter calculator 30 explained in connection with FIG. 1.

The signal outputted out of the filter 60 corresponds to what is obtained by differentiating the signal outputted out of the integrator 20. That is, in measuring jitter in the signal-under-measurement based on the signal outputted out of the filter 60, the period jitter in the signal-under-measurement can be directly measured. The jitter calculator 30 may measure either one or both of the timing jitter and period jitter in the signal-under-measurement. In measuring the timing jitter in the signal-under-measurement, the jitter measuring apparatus 40 may not have the integrator 20. Still more, the jitter calculator 30 may be a device for measuring waveform of the signal outputted out of the filter 60 or of the signal outputted out of the integrator 20.

The carrier frequency components has been removed from the both signals outputted out of the filter 60 or of the integrator 20. Therefore, the jitter calculator 30 can measure the jitter component without measuring unnecessary components such as triangular wave components. Accordingly, it can calculate the jitter accurately.

Figure 5:
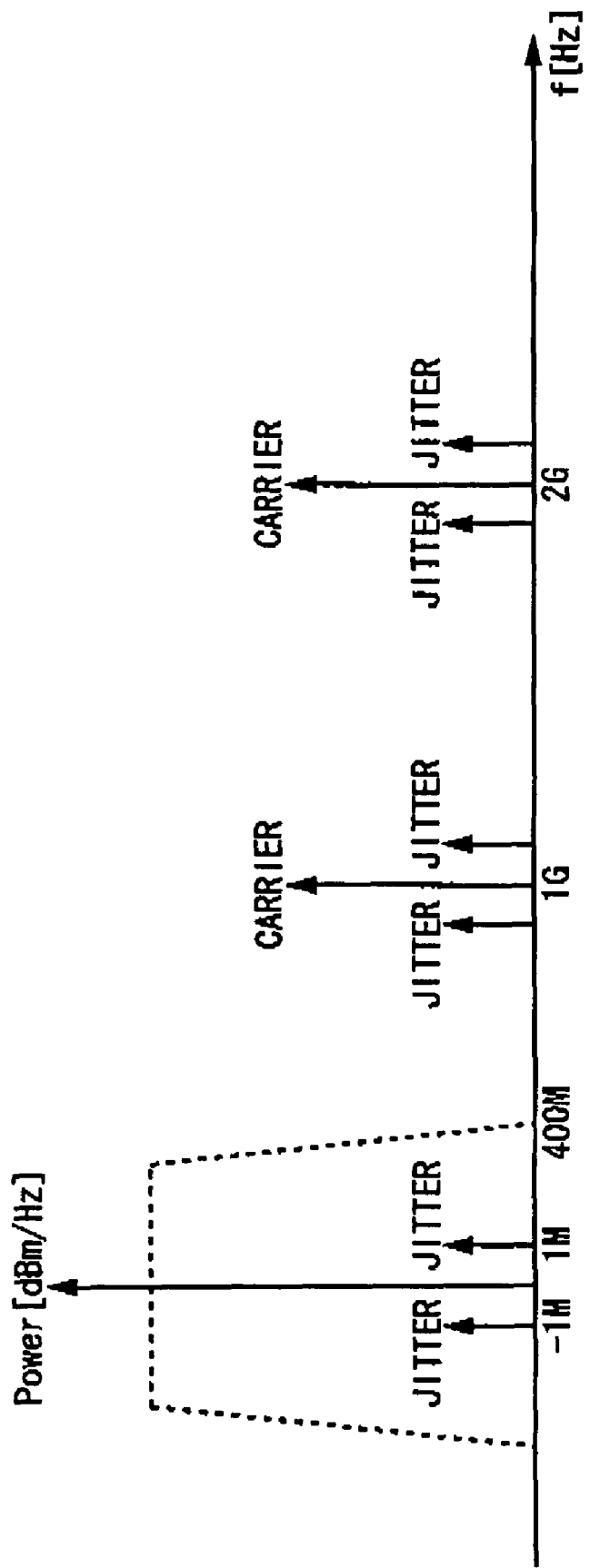
FIG. 5 is a chart for explaining signals outputted out of a filter.

FIG. 5 is a chart for explaining the signal outputted out of the filter 60. In this example, an explanation will be made by assuming that the cut-off frequency of the signal-under-measurement is 1 GHz, the frequency of jitter is 1 MHz and the cut-off frequency of the filter 60 is 400 MHz. FIG. 5 shows only spectra of carrier and jitter components.

When the carrier frequency of the signal-under-measurement is 1 GHz, spectra of the carrier component appear at each frequency of 1 GHz, 2 GHz, . . . as shown in FIG. 5 in the spectrum of the pulse signal. Still more, spectra of the jitter components appear at frequencies of (the frequency of each carrier component+/−1 MH) and (zero Hz+/−1 MHz).

The filter 60 removes the frequency components higher than the cut-off frequency, i.e., 400 MHz, from the frequency components of the pulse signal. It allows the carrier frequency components to be removed and only the jitter component to be outputted.

Figure 6:
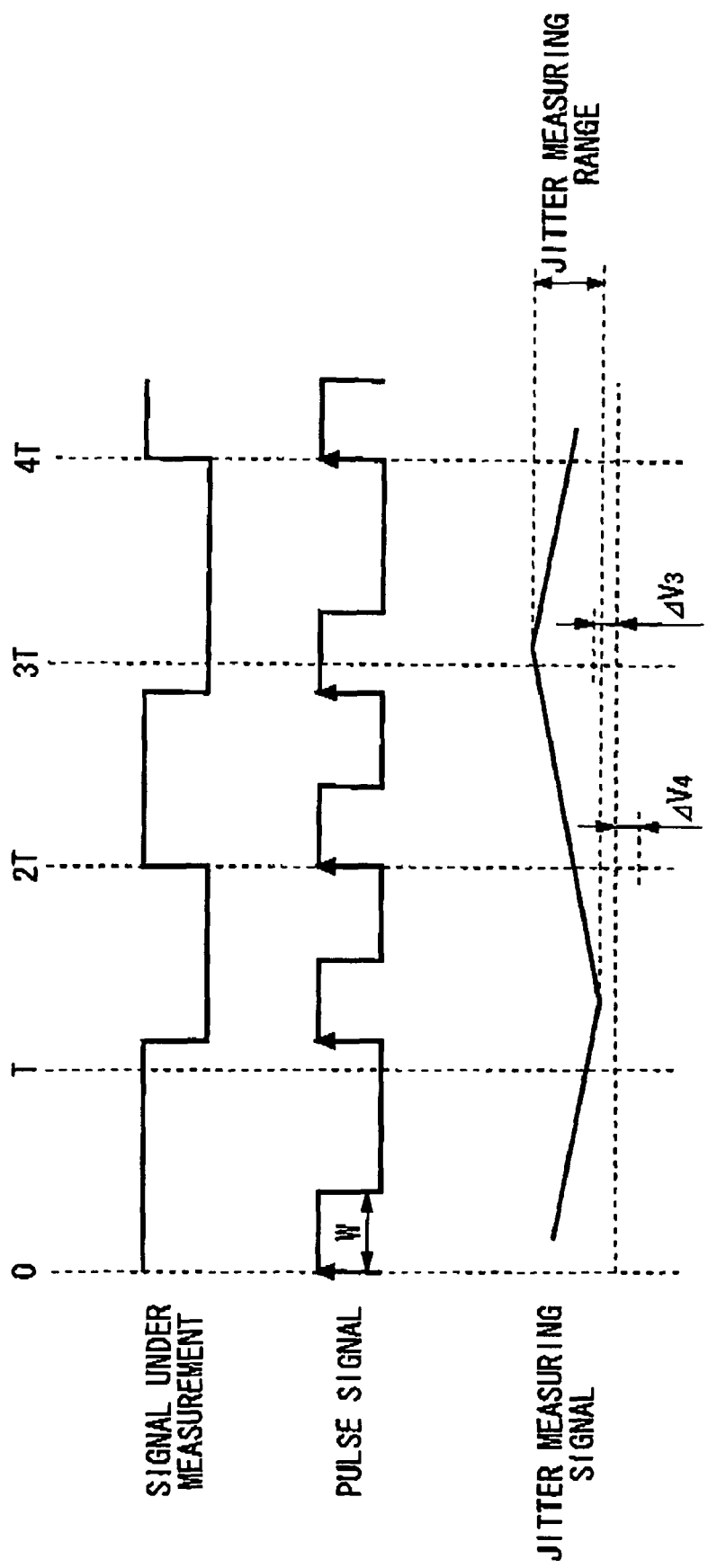
FIG. 6 is a chart showing one exemplary jitter measuring signal outputted out of the integrator.

FIG. 6 is a chart showing one exemplary jitter measuring signal outputted out of the integrator 20. The integrator 20 outputs the jitter measuring signal from which the carrier frequency components have been removed by the filter 60 as described above. Amplitude of the jitter measuring signal of this example is smaller than that of the jitter measuring signal shown in FIG. 3. Therefore, the integrator 20 can output a signal having a large signal-to-noise ratio by effectively utilizing the dynamic range of the amplifying circuit provided in the output stage.

Figure 7:
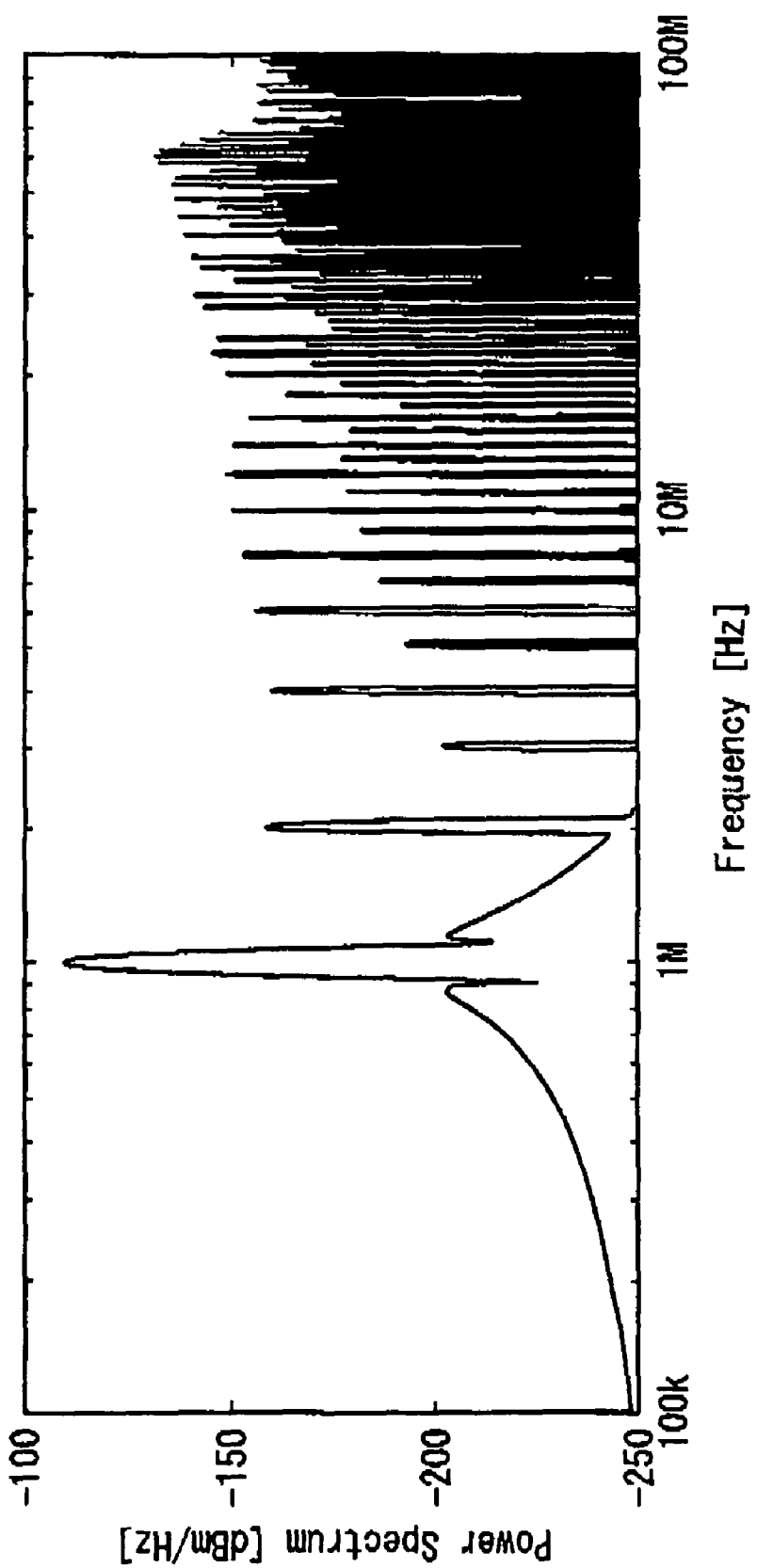
FIG. 7 is a chart showing one exemplary enlarged view of a spectrum of a pulse signal outputted out of the pulse generator.

FIG. 7 shows one exemplary enlarge view of the spectrum of the pulse signal outputted out of the pulse generator 10. This example shows the spectrum of the pulse signal when jitter of 1 MHz is applied to the signal-under-measurement. When the jitter of 1 MHz is applied to the signal-under-measurement, components of higher-order harmonics of the jitter component appear at frequencies of integer multiples of 1 MHz as shown in FIG. 7. Among those spectra, the filter 60 passes components, whose frequencies are smaller than the cut-off frequency.

Figure 8:
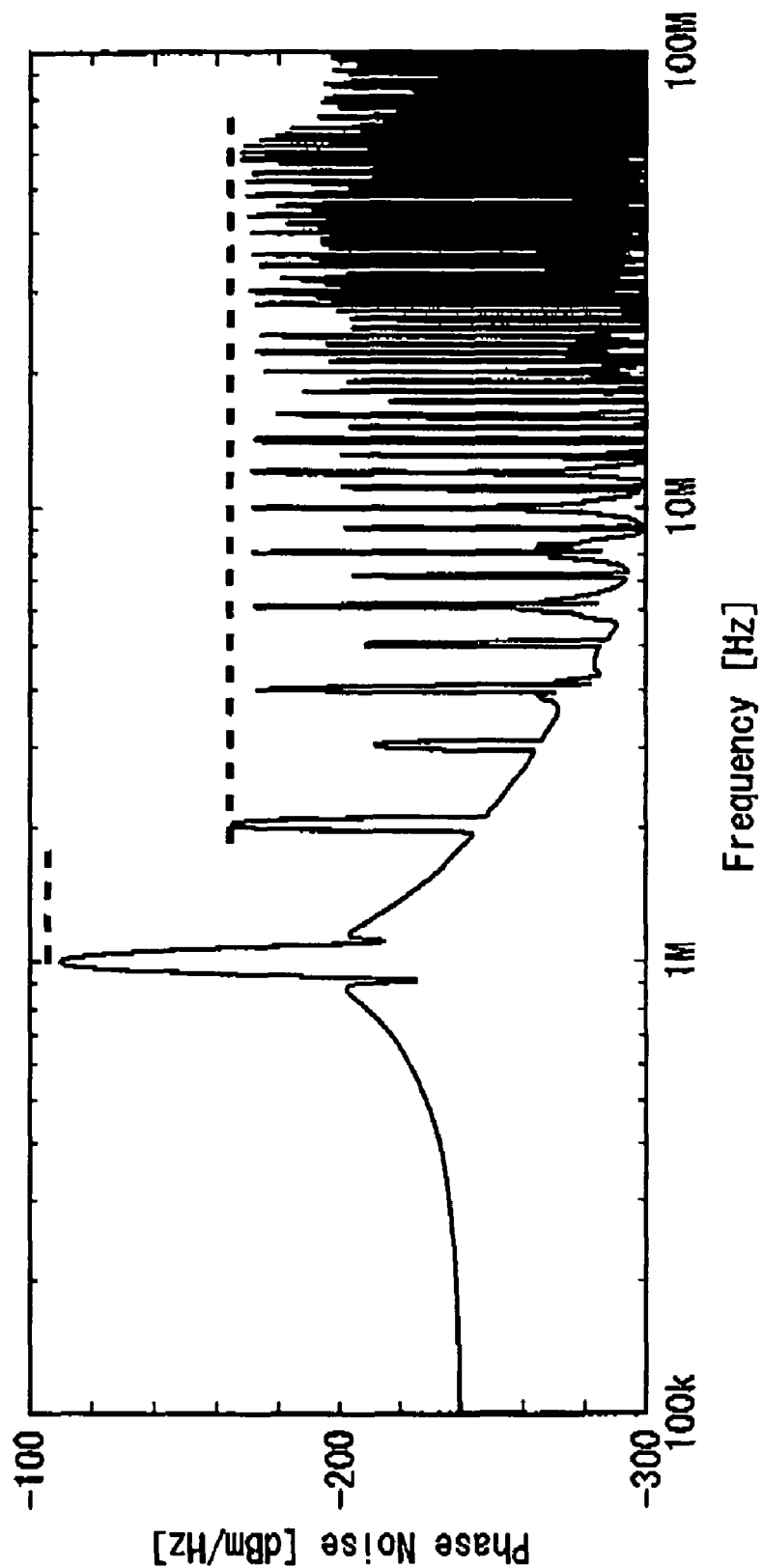
FIG. 8 is a chart showing one exemplary enlarged view of a spectrum of a signal outputted out of the integrator.

FIG. 8 shows one exemplary enlarged view of the spectrum of the signal outputted out of the integrator 20. In this example, the components of the higher-order harmonics are almost flat. The spectral components of the higher harmonics of the waveform of the timing jitter of 1 MHz become almost flat similarly to the spectrum shown in FIG. 8. Accordingly, it can be seen that the signal outputted out of the integrator 20 is the waveform of the timing jitter.

Figure 9:
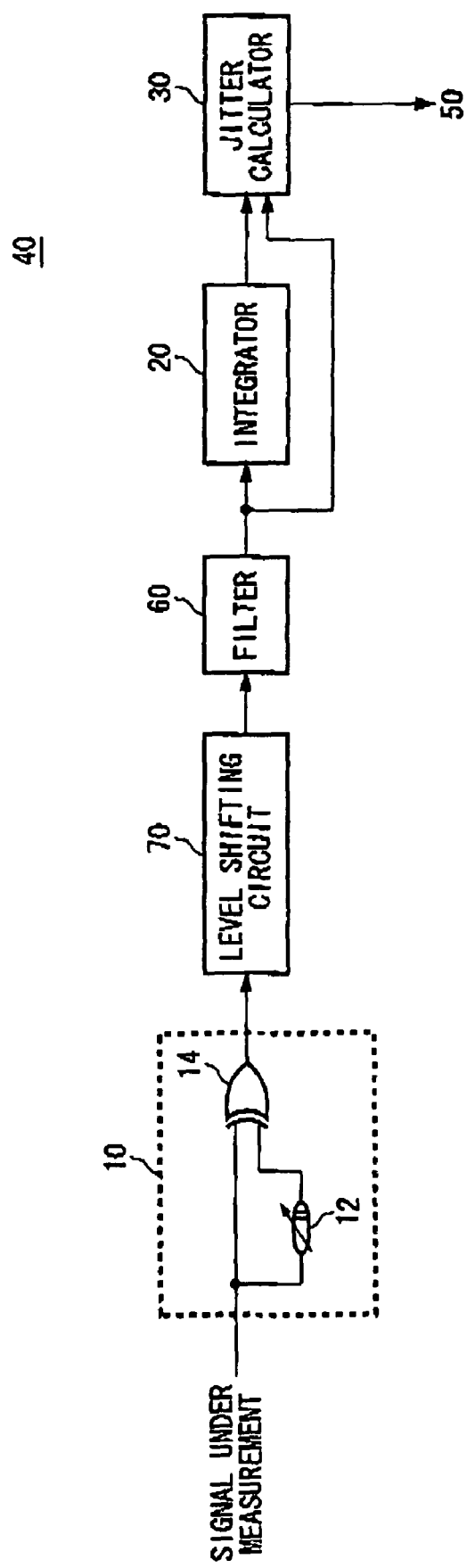
FIG. 9 is a diagram showing another exemplary configuration of a jitter measuring apparatus.

FIG. 9 is a diagram showing another exemplary configuration of the jitter measuring apparatus 40. In addition to the configuration of the jitter measuring apparatus 40 explained in connection with FIG. 4, the jitter measuring apparatus 40 of this example has a level shifting circuit 70.

The level shifting circuit 70 applies the pulse signal outputted out of the pulse generator 10 to the filter 60 by shifting its signal level to input signal level corresponding to characteristics of the filter 60. Here, the characteristics of the filter 60 may be the signal input range of the filter 60 for example. The order may be changed so as to apply the output of the filter 60 to the level shifting circuit 70.

When the filter 60 is a RC filter, the signal applied to the filter 60 is preferable to be within a voltage range corresponding to a capacitive value of a capacitor provided in the filter 60. The level shifting circuit 70 may shift the signal level so that a DC component of the signal applied to the integrator 20 is almost zeroed.

Figure 10:
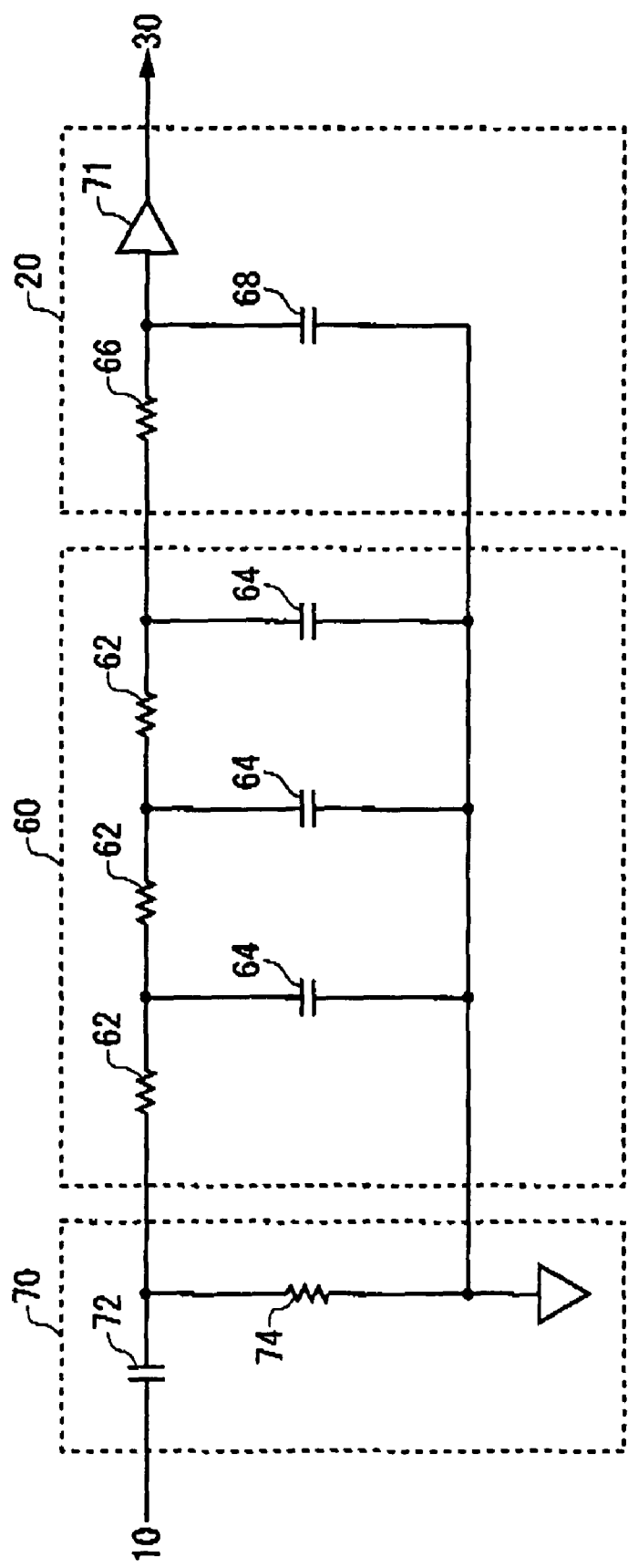
FIG. 10 is a diagram showing one configuration of a level shifting circuit, the filter and the integrator.

FIG. 10 is a diagram showing one exemplary configuration of the level shifting circuit 70, the filter 60 and the integrator 20. In this example, the filter 60 is a RC filter and has resistors 62 and capacitors 64 connected in multiple stages.

The level shifting circuit 70 has a capacitor 72 and a resistor 74. The capacitor 72 is provided in a transmission line for transmitting the pulse signal to the filter 60 to remove a DC component of the pulse signal. The resistor 74 is provided between the transmission line and a predetermined potential to specify reference voltage of the signal passing through the capacitor 72 corresponding to the predetermined voltage. The signal level of the pulse signal is shifted to predetermined voltage level by such configuration as described above. In this example, the signal level is shifted to grand (0 V) level. The predetermined voltage may be determined corresponding to the capacitive value of the capacitor 64.

The integrator 20 has a resistor 66, a capacitor 68 and an amplifying circuit 71. The capacitor 68 is charged/discharged by the current signal outputted out of the filter 60 via the resistor 66. Thereby, the capacitor 68 outputs a voltage value obtained by integrating the current signal. The amplifying circuit 71 outputs the voltage value outputted out of the capacitor 68 by amplifying by a predetermined amplification gain.

Such configuration allows the pulse signal suitable to the characteristics of the filter 60 to be applied to the filter 60. Although the level shifting circuit 70 is provided at the input stage of the filter 60 in this case, the level shifting circuit 70 may be provided at the input stage of the integrator 20 in another case. In this case, the level shifting circuit 70 may shift the level of the signal outputted out of the filter 60 corresponding to the capacitive value of the capacitor 68.

Figure 11:
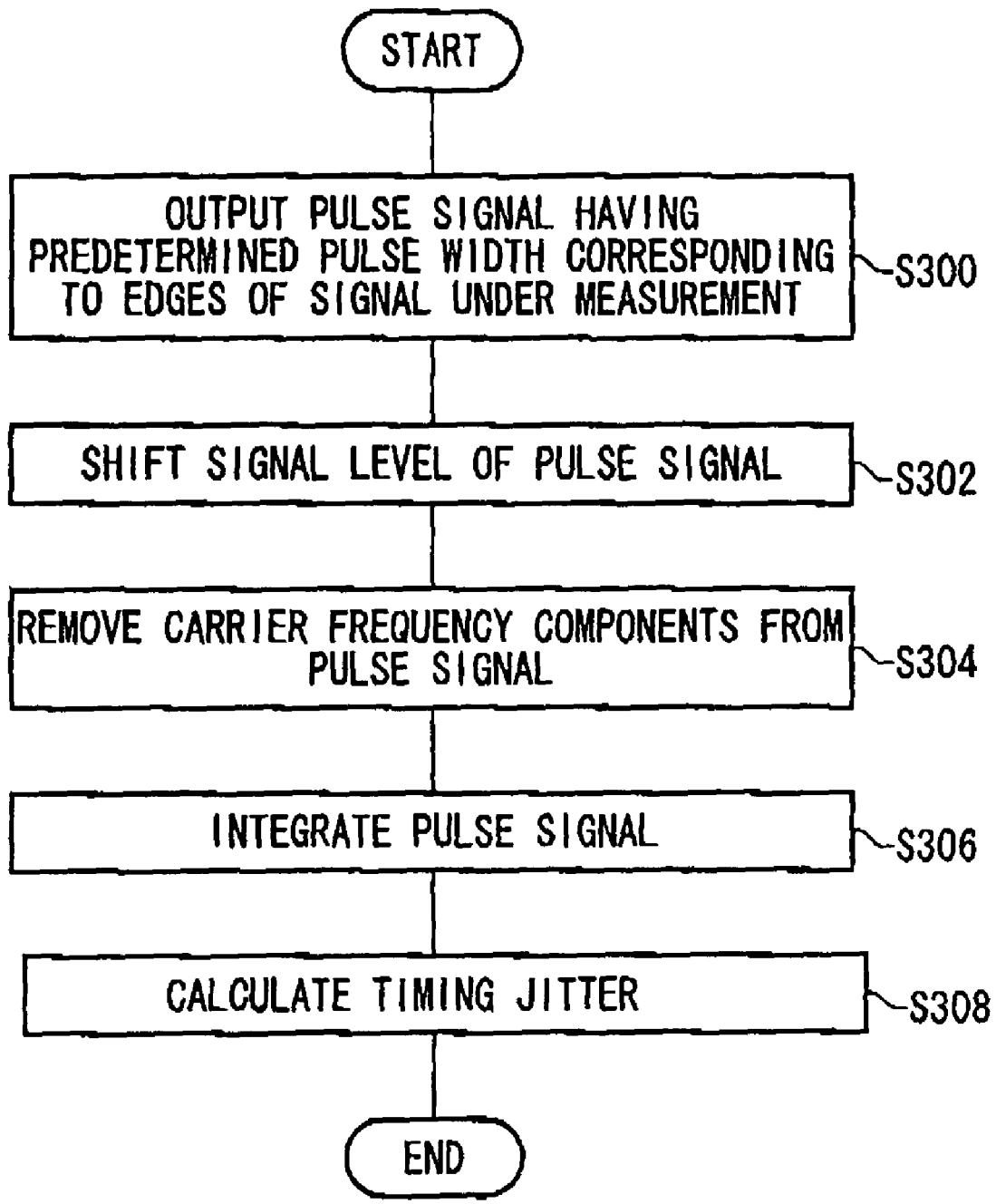
FIG. 11 is a flowchart showing one exemplary operation of the jitter measuring apparatus.

FIG. 11 is a flowchart showing one exemplary operation of the jitter measuring apparatus 40. At first, the pulse generator 10 generates a pulse signal having a predetermined pulse width corresponding to edges of the signal-under-measurement in a pulse generating step S300. Next, the level shifting circuit 70 shifts signal level of the pulse signal to predetermined level in a level shifting step S302.

The filter 60 removes the carrier frequency components of the signal-under-measurement from the pulse signal in a filtering step S304. Then, the integrator 20 integrates the output signal of the filter 60 in an integrating step S306. The jitter calculator 30 calculates jitter in the signal-under-measurement in a jitter calculating step S308. In the step S308, the jitter calculator 30 may calculate the period jitter or timing jitter of the signal-under-measurement. The integrating Step S306 may be omitted in calculating the period jitter. Still more, the level shifting step S302 may be set as a process carried out after the filtering step S304.

The jitter measuring apparatus 40 shown in FIG. 9 may be represented by a linear model expressed by the following equation: Where, X(s) is Laplace transformation of the pulse signal x(t) outputted out of the pulse generator 10, $X_0/s$ is a level shift component applied by the level shifting circuit 70, G(s) is transfer function of the filter 60, Kc/s is transfer function of the integrator 20 and $\Delta\Phi(s)$ is Laplace transformation of the jitter component $\Delta\Phi(t)$ contained in the signal-under-measurement.

It can be seen from the above equation that the jitter output does not change even if the filter 60 and the integrator 20 are exchanged with each other in the jitter measuring apparatus 40. Due to that, the jitter measuring apparatus 40 shown in FIG. 9 can obtain the jitter output equal to that of the jitter measuring apparatus 140 shown in FIG. 1. Still more, the jitter measuring apparatus 40 shown in FIG. 9 can measure with the large signal-to-noise ratio as described above.

Still more, the measurement can be carried out in the same manner even when the level shifting circuit 70 and the filter 60 are exchanged with each other in the jitter measuring apparatus 40 shown in FIG. 9. Because the level shift component $X_0$ applied by the level shifting circuit 70 is a constant value, it has only the DC component. Therefore, when a gain of the filter 60 is $G_0$, a bias shift component outputted out of the filter 60 becomes $G_0X_0$ [V], i.e., a constant value. Accordingly, the measurement can be carried out also in the same manner by inserting the level shifting circuit 70, which has been disposed on the pre-stage of the filter 60, between the filter 60 and the integrator 20 and by setting a level shift value as $G_0X_0$.

Figure 12:
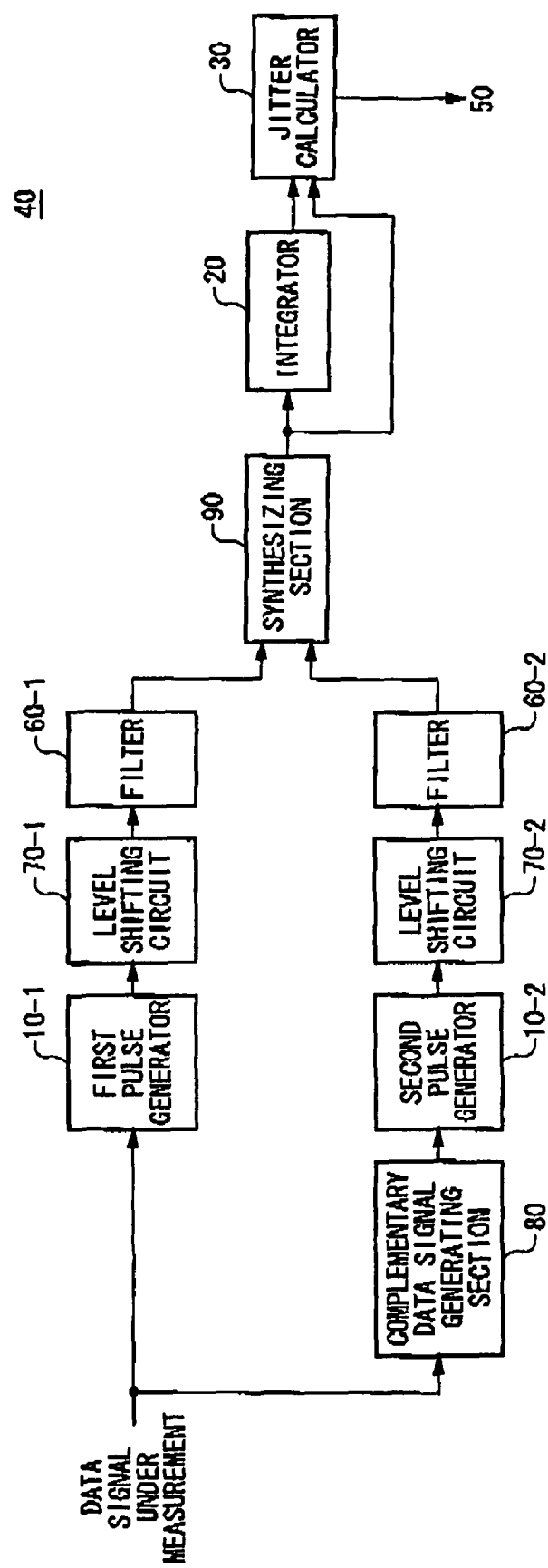
FIG. 12 is a diagram showing one exemplary configuration of the jitter measuring apparatus.

FIG. 12 is a diagram showing one exemplary configuration of the jitter measuring apparatus 40. The jitter measuring apparatus 40 of this example is an apparatus for measuring jitter in a data-signal-under-measurement having an almost constant data rate and has a complementary data signal generating section 80, a first pulse generator 10-1, a second pulse generator 10-2, a first level shifting circuit 70-1, a second level shifting circuit 70-2, a first filter 60-1, a second filter 60-2, a synthesizing section 90, the integrator 20 and the jitter calculator 30. The jitter measuring apparatus 40 may not have the first and second level shifting circuits 70-1 and 70-2. The first and second level shifting circuits 70-1 and 70-2 may be also disposed behind the first and second filters 60-1 and 60-2 or behind the synthesizing section 90.

The first and second pulse generators 10-1 and 10-2 may have the same function and structure with the pulse generator 10 explained in connection with FIGS. 4 through 10. Still more, the first and second level shifting circuits 70-1 and 70-2 may have the same function and structure with the level shifting circuit 70 explained in connection with FIGS. 4 through 10. Further, the first and second filters 60-1 and 60-2 may have the same function and structure with the filter 60 explained in connection with FIGS. 4 through 10. The integrator 20 and the jitter calculator 30 may also have the same function and structure with the integrator 20 and the jitter calculator 30 explained in connection with FIGS. 4 through 10.

The complementary data signal generating section 80 generates a complementary data signal having edges at every boundary of data sections over which, since data values of the data-signal-under-measurement do not change, the data-signal-under-measurement has no edge. For instance, when the edges of the data-signal-under-measurement and those of the complementary data signal are aligned on the same time axis, the complementary data signal may be what the aligned edges of the both data-signal-under-measurement and complementary data signal are disposed at the almost same time intervals. The data section of the data-signal-under-measurement is a time interval during which non-repeating single data is held in the serially transmitted data-signal-under-measurement for example. It may be also a time during which symbol data is held in a transmitted multi-valued data-signal-under-measurement. That is, the data section may be a bit interval or a symbol interval of the data-signal-under-measurement.

The first pulse generator 10-1 detects edges of the data-signal-under-measurement and outputs a first pulse signal having a predetermined pulse width corresponding to the edges. The second pulse generator 10-2 detects the boundaries of the data section where the data value do not change and outputs a second pulse signal having a predetermined pulse width corresponding to the timing of the detected boundaries of the data section. In this example, the second pulse generator 10-2 detects edges of the complementary data signal outputted out of the complementary data signal generating section 80 and outputs the second pulse signal having preset pulse width corresponding to the edges.

The first level shifting circuit 70-1 shifts a signal level of the first pulse signal outputted out of the first pulse generator 10-1. The 70-2 shifts a signal level of the second pulse signal outputted out of the second pulse generator 10-2. Preferably, the level shift values in the first and second level shifting circuits 70-1 and 70-2 are almost equal.

The first filter 60-1 removes the carrier frequency components of the data-signal-under-measurement from the first pulse signal. The second filter 60-2 removes the carrier frequency components of the data-signal-under-measurement from the second pulse signal. Preferably, frequency bands passed by the first and second filters 60-1 and 60-2 are almost equal.

The synthesizing section 90 outputs a pulse signal obtained by synthesizing the signal that has passed the first filter 60-1 and the signal that has passed the second filter 60-2. For example, the synthesizing section 90 may add the signal that has passed the first filter 60-1 with the signal that has passed the second filter 60-2.

The integrator 20 integrates the signal outputted out of the synthesizing section 90. The jitter calculator 30 calculates jitter in the data-signal-under-measurement based on the signal outputted out of the synthesizing section 90 or the signal outputted out of the integrator 20.

When edges of the both data-signal-under-measurement and complementary data signal are taken into consideration, the edges are arranged at almost constant intervals. Such operation enables the integrator 20 and the jitter calculator 30 to measure and operate at almost constant intervals and to measure the jitter accurately by reducing variance of measured values which is otherwise caused by difference of measuring intervals and others.

Figure 13:
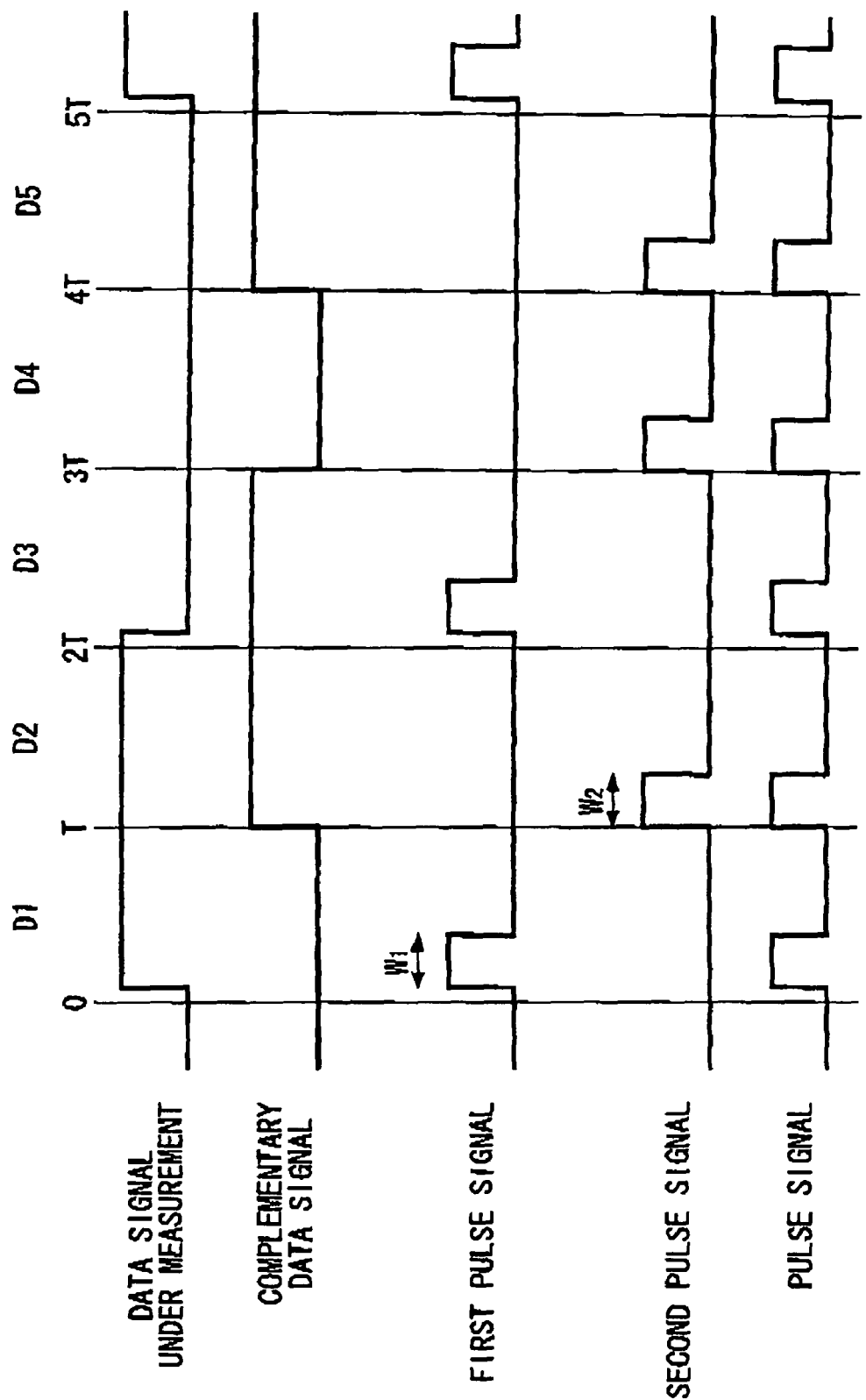
FIG. 13 is a timing chart showing one exemplary operation of a complementary data signal generating section and a pulse generator.

FIG. 13 is a timing chart showing one exemplary operation of the complementary data signal generating section 80 and the pulse generator 10. In connection with the complementary data signal generating section 80, FIG. 13 shows a case when the time interval of the data section of the data-signal-under-measurement is T and its data pattern during a time (0-6T) is 110001.

In the example shown in FIG. 2, sections (0-T, T-2T, 2T-3T, etc.) correspond to the data sections (D1, D2, D3, etc.). (0, T, 2T, 3T, etc.) are the boundaries of respective data sections. In this example, the data values of the data-signal-under-measurement change at the boundaries (0, 2T and 5T) of the data sections and do not change at the boundaries (T, 3T and 4T) of the data sections. Accordingly, the complementary data signal generating section 80 generates the complementary data signal having edges at the boundaries (T, 3T and 4T) of the data sections where no edge of the data-signal-under-measurement exists.

Because the data-signal-under-measurement has the almost constant data sections, timing of the edge of the data-signal-under-measurement almost coincides with either one of the timings (0, T, 2T, etc.). In such a case, preferably the complementary data signal generating section 80 generates the complementary data signal having edges at the boundaries of the data sections where there exists no edge of the data-signal-under-measurement. Thereby, in terms of the edges of the both data-signal-under-measurement and complementary data signal, the edges are disposed at almost constant intervals. Through such operations, the integrator 20 and the jitter calculator 30 can measure and operate with almost constant intervals and can measure jitter accurately by reducing variance of measured values which is otherwise caused due to the different time intervals.

Figure 14:
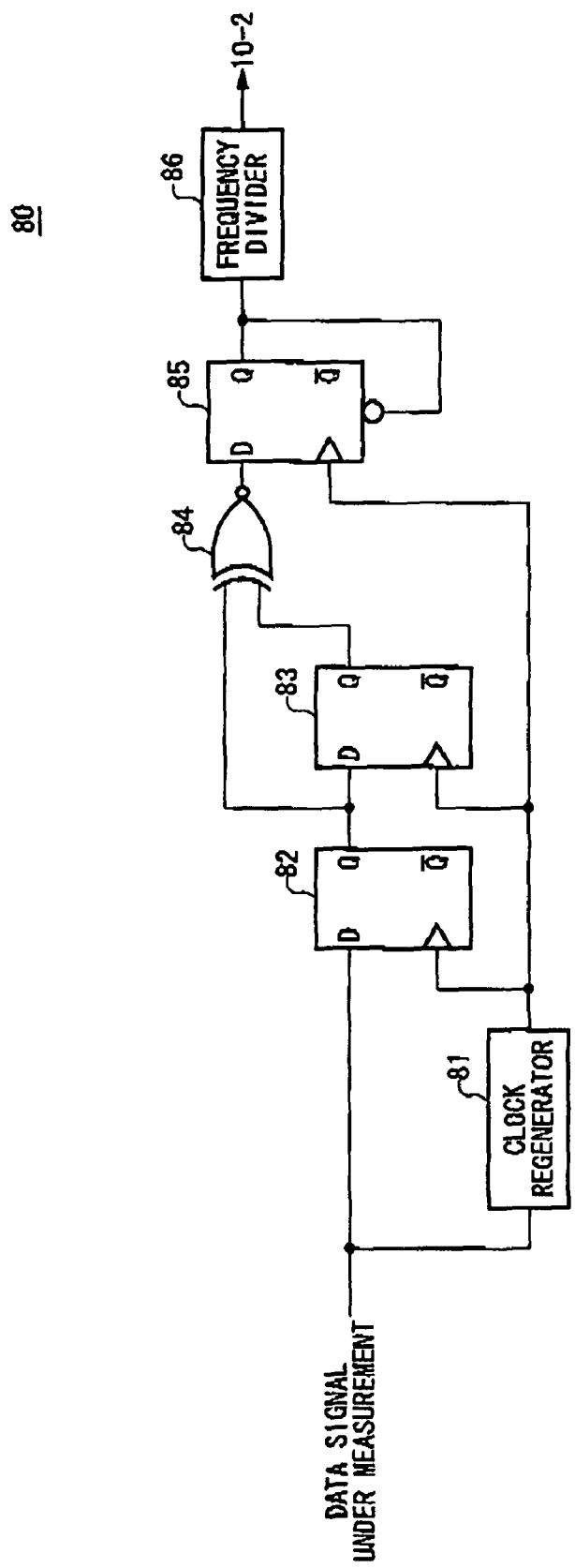
FIG. 14 is a diagram showing one exemplary configuration of the complementary data signal generating section.

FIG. 14 is a diagram showing one exemplary configuration of the complementary data signal generating section 80. The complementary data signal generating section 80 has a clock regenerator 81, a first D flip-flop 82, a second D flip-flop 83, a coincidence detector 84, a third D flip-flop 85 and a frequency divider 86.

Figure 15A:
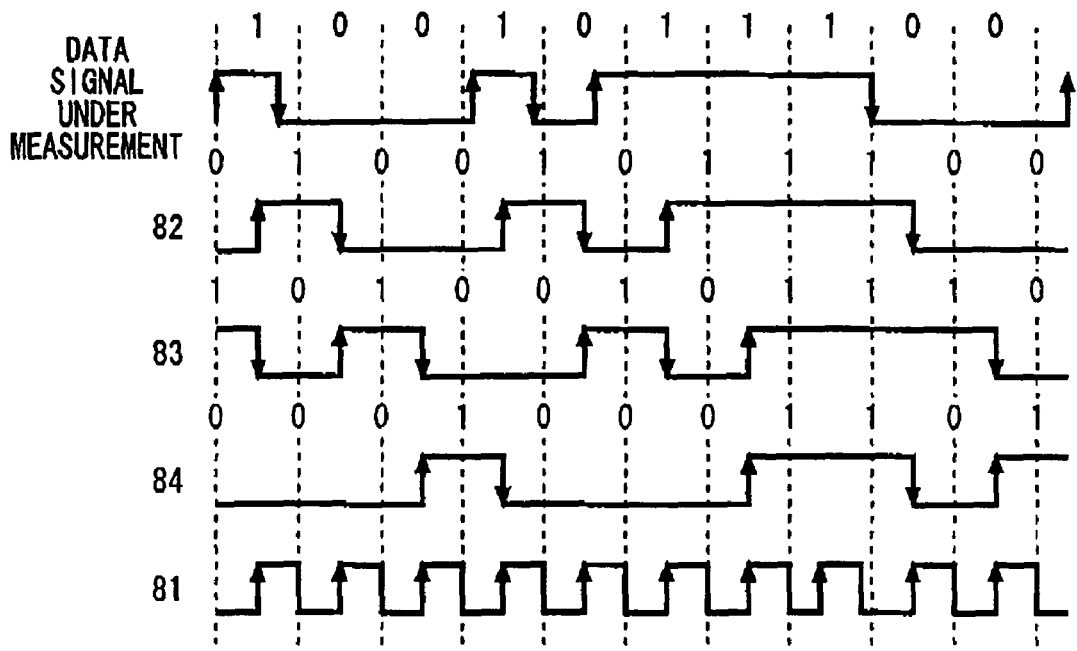
FIGS. 15A and 15B are timing charts showing one exemplary operation of the complementary data signal generating section.
Figure 15B:
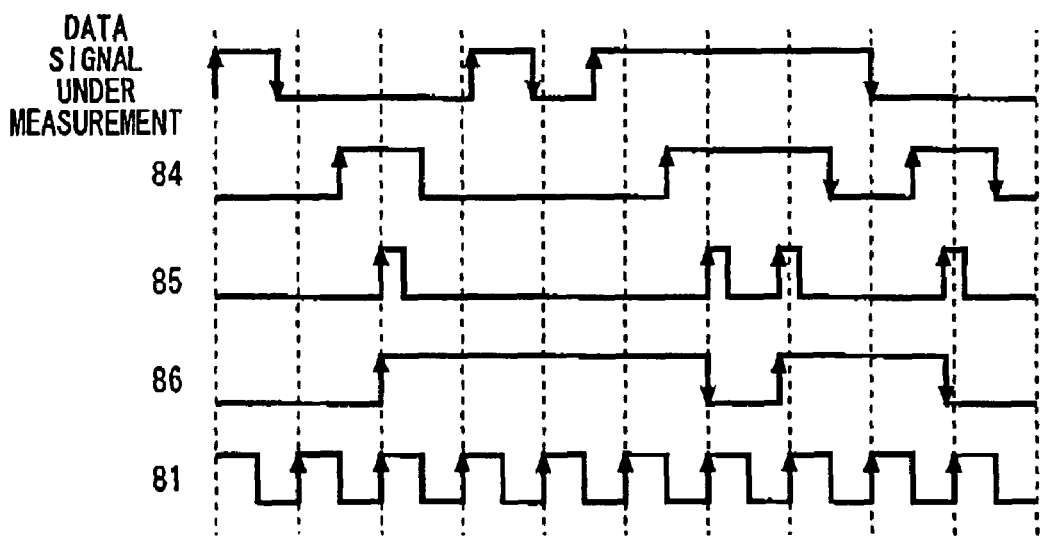

FIGS. 15A and 15B are timing charts for explaining one exemplary operation of the complementary data signal generating section 80.

FIG. 15A shows the operation from the clock regenerator 81 to the coincidence detector 84 and FIG. 15B shows the operation from the coincidence detector 84 to the frequency divider 86.

Based on the data-signal-under-measurement, the clock regenerator 81 generates a clock signal having an almost same period with the data section of the data-signal-under-measurement. The first D flip-flop 82 takes in and outputs the data-signal-under-measurement with each clock signal.

The second D flip-flop 83 takes in and outputs the signal outputted out of the first D flip-flop 82 corresponding to the clock signal. That is, the second D flip-flop 83 outputs the signal outputted out of the first D flip-flop 82 by delaying by one period of the data section of the data-signal-under-measurement.

The coincidence detector 84 outputs an coincident signal indicating logic H when the value of the signal outputted out of the first D flip-flop 82 is equal to the value of the signal outputted out of the second D flip-flop 83.

The third D flip-flop 85 takes in and outputs the signal outputted out of the coincidence detector 84 corresponding to the clock signal. The internal data is reset by its output signal. That is, when the third D flip-flop 85 receives the rising edge of the clock signal, it outputs a pulse having a very small pulse width which is shorter than the time interval of the data section in the data-signal-under-measurement under the condition of the signal received from the coincidence detector 84 indicating the logic value H.

The frequency divider 86 divides the signal outputted out of the third D flip-flop 85 by two to generate the complementary data signal. Here, 'divide by two' means to generate a signal whose logic value changes corresponding to either the rising edge or falling edge of the signal outputted out of the third D flip-flop 85 as shown in FIG. 15B.

The complementary data signal of the data-signal-under-measurement may be generated readily by configuring as described above.

Figure 16:
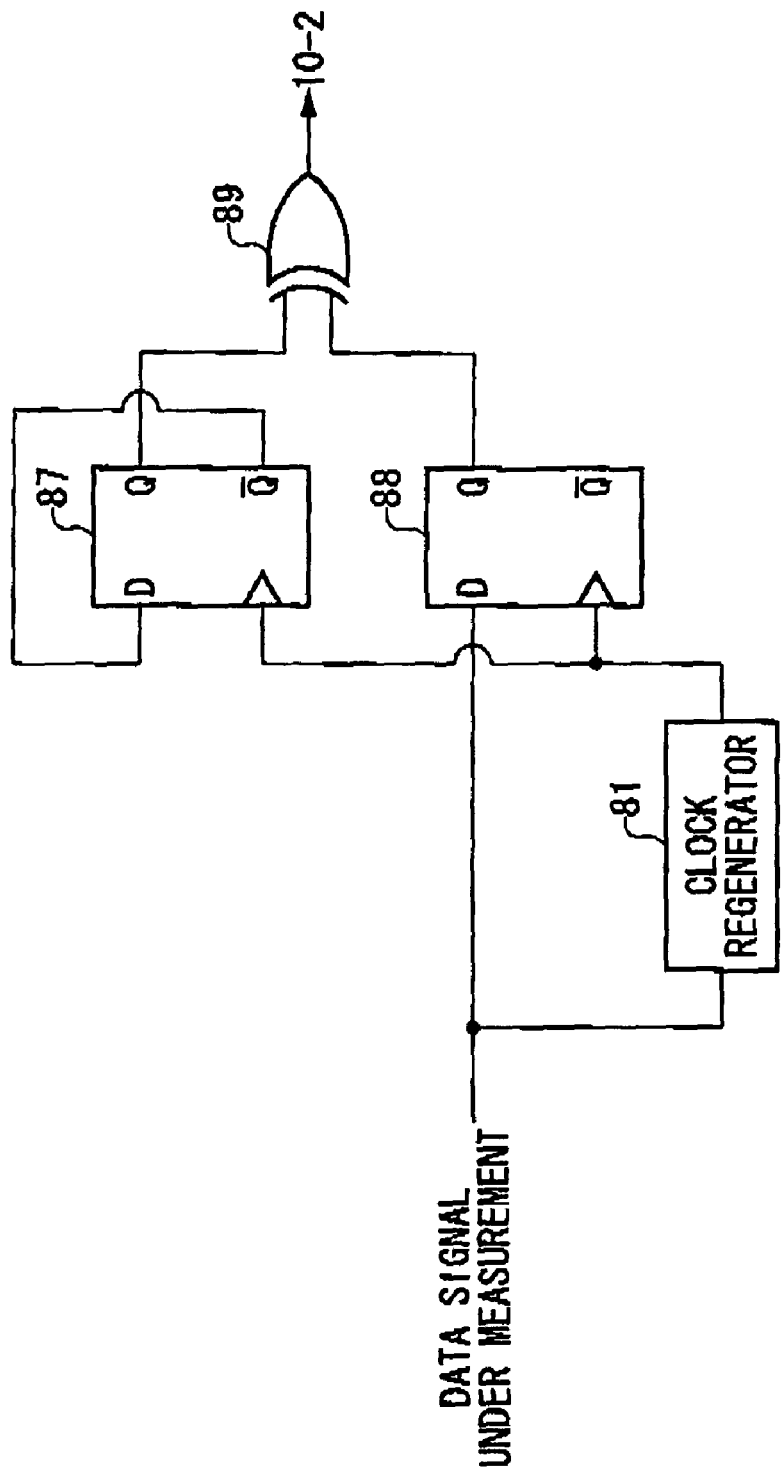
FIG. 16 is a diagram showing another exemplary configuration of the complementary data signal generating section.

FIG. 16 is a diagram showing another exemplary configuration of the complementary data signal generating section 80. The complementary data signal generating section 80 of this example has the clock regenerator 81, a fourth D flip-flop 87, a fifth D flip-flop 88 and an exclusive OR gate 89.

Figure 17:
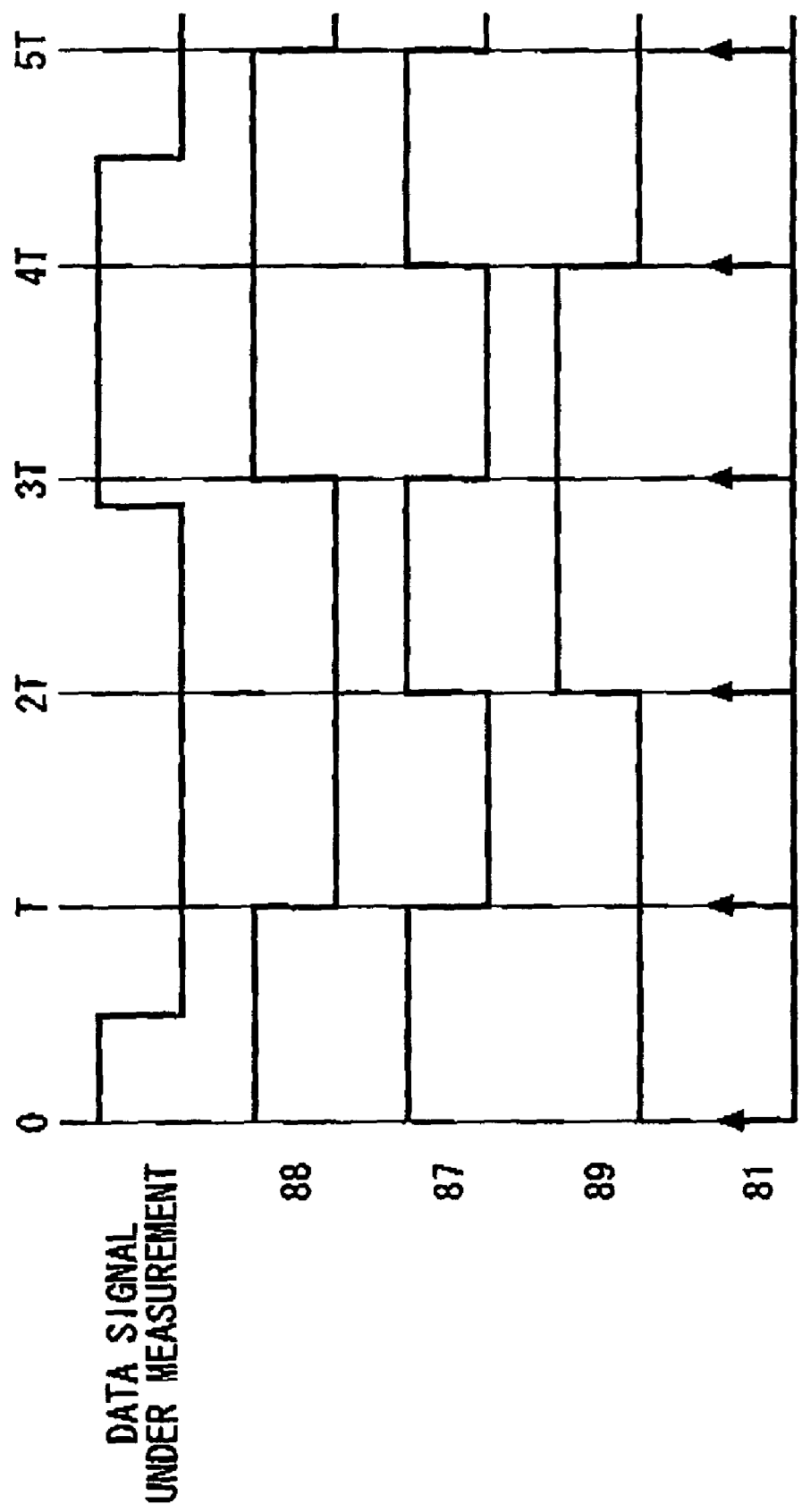
FIG. 17 is a timing chart showing one exemplary operation of the complementary data signal generating section shown in FIG. 16.

FIG. 17 is a timing chart showing one exemplary operation of the complementary data signal generating section 80 shown in FIG. 16. Based on the data-signal-under-measurement, the clock regenerator 81 generates the clock signal having the almost same period with the data section of the data-signal-under-measurement. The fifth D flip-flop 88 takes in and outputs the data-signal-under-measurement with each clock signal. The clock signal is applied to a clock input terminal of the fourth D flip-flop 87 and an inverting output terminal and a data input terminal thereof are connected. That is, the fourth D flip-flop 87 generates a signal whose logic value is inverted corresponding to the clock signal.

The exclusive OR gate 89 outputs an exclusive OR of the signal outputted out of the fourth D flip-flop 87 and the signal outputted out of the fifth D flip-flop 88 is the complementary data signal.

Such configuration allows the complementary data signal to be generated with the simple structure. Still more, although the initial value of the signal outputted out of the fourth D flip-flop 87 at the time 0 has been set as the logic value H in FIG. 17, this configuration allows the complementary data signal keeping the data transition timings to be outputted just by inverting the outputted signal pattern out of the exclusive OR gate 89 even if the initial value is the logic value L.

Figure 18:
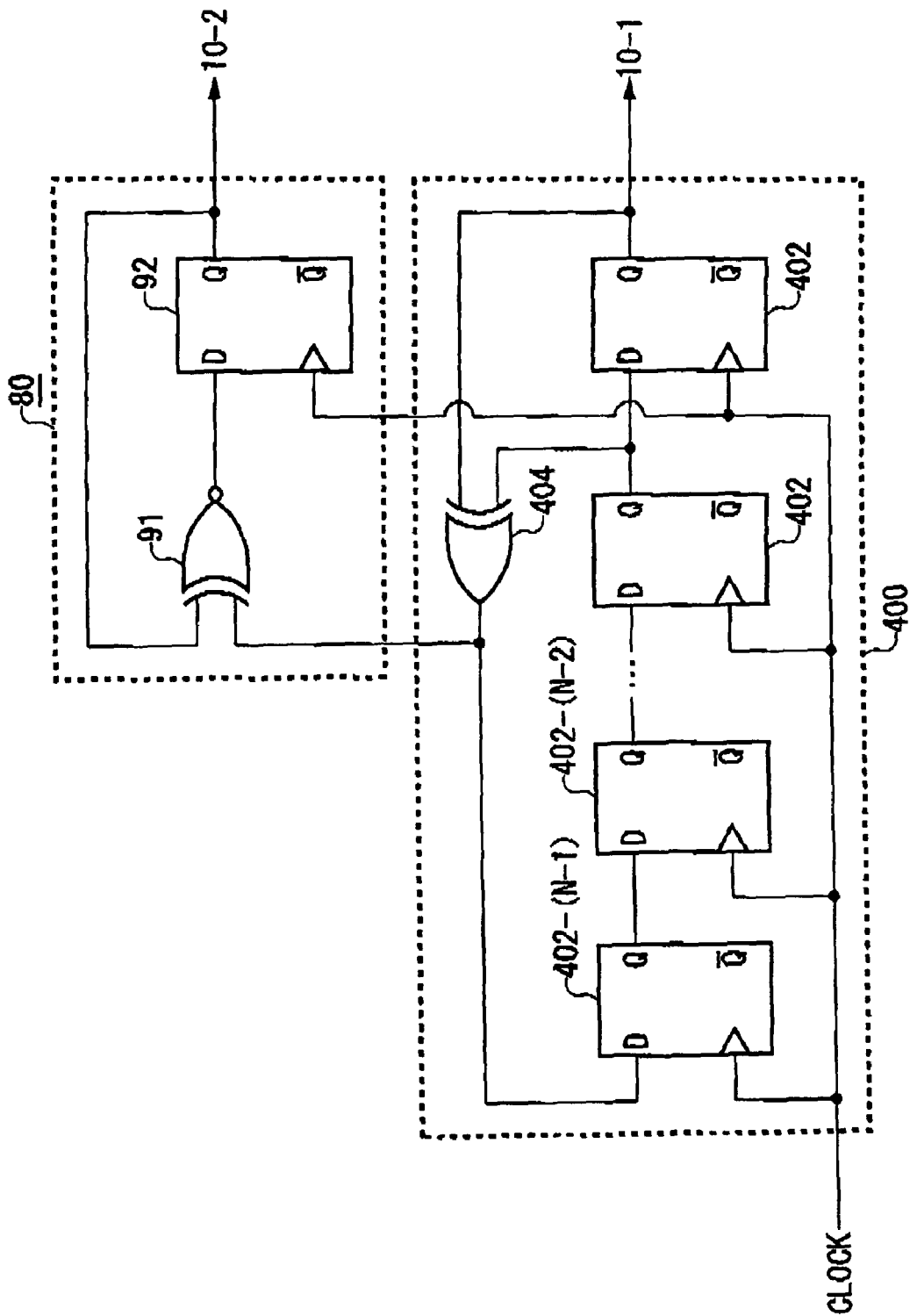
FIG. 18 is a diagram showing another exemplary configuration of the complementary data signal generating section.

FIG. 18 is a diagram showing another exemplary configuration of the complementary data signal generating section 80. In this example, the jitter measuring apparatus 40 receives a pseudo random pattern sequence outputted out of a device-under-test 400 as a data-signal-under-measurement.

Figure 19:
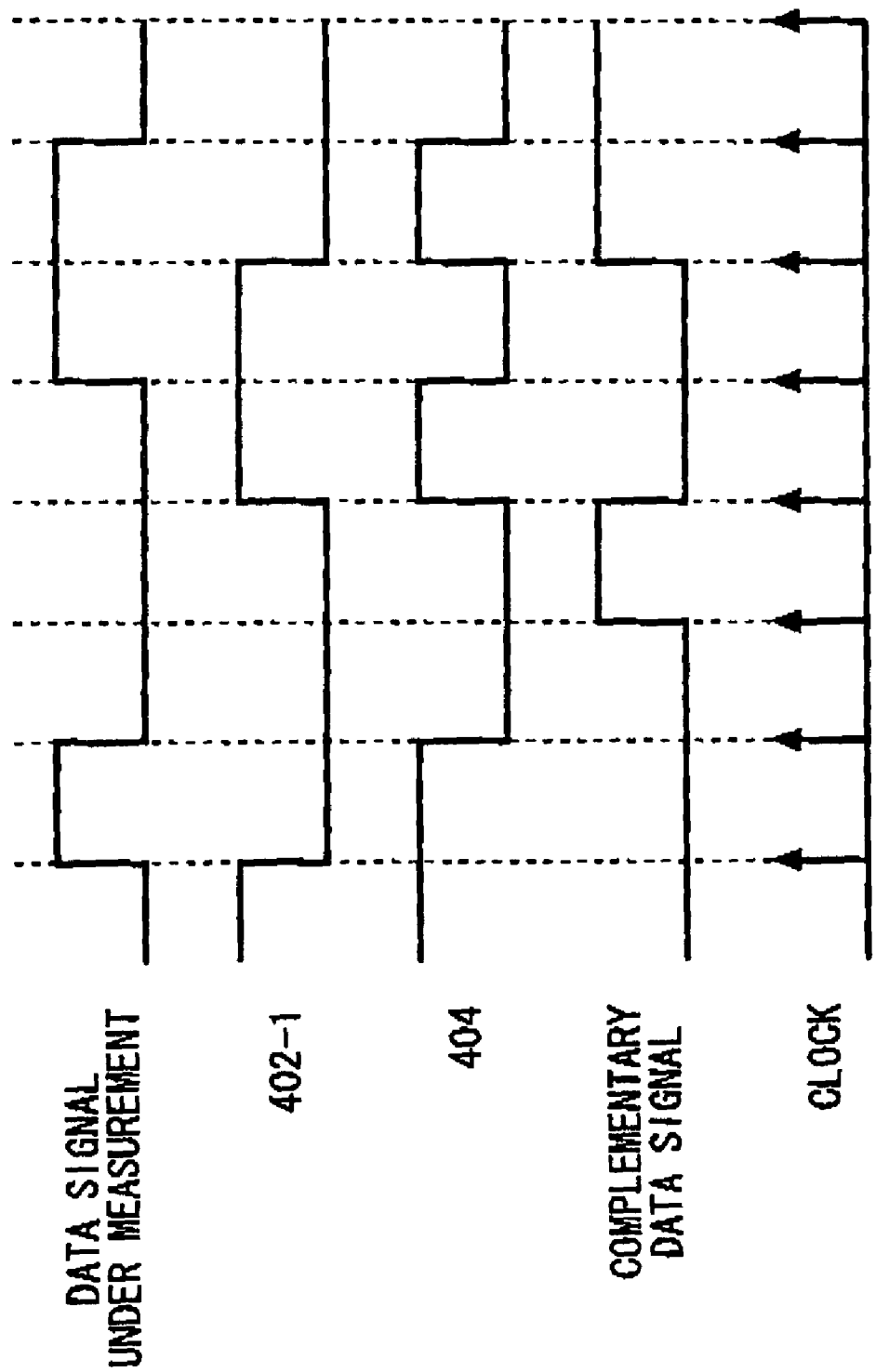
FIG. 19 is a timing chart showing one exemplary operation of a device-under-test and the complementary data signal generating section shown in FIG. 18.

FIG. 19 is a timing chart showing one exemplary operation of the device-under-test 400 and the complementary data signal generating section 80 shown in FIG. 18.

The device-under-test 400 has N cascade-connected D-flip-flops (402-0 through 402-(N−1), referred to as 402 in general hereinafter) and an exclusive OR gate 404. Each of the D flip-flops 402 takes in and outputs a signal outputted out of a positive output terminal Q of the preceding D-flip-flop 402 corresponding to a given clock. The exclusive OR gate 404 outputs an exclusive OR of a signal outputted out of the final D flip-flop 402-0 and a signal outputted out of its preceding D flip-flop 402-1. A signal outputted out of the exclusive OR gate 404 is applied to the front-most D flip-flop 402-(N−1). That is, the exclusive OR gate 404 inputs a logic value 0 to the front-most D flip-flop 402-(N−1) when the logic value of the signal outputted out of the final D flip-flop 402-0 continuously holds a same value and inputs a logic value 1 when the value is different. Through such configuration, the final D flip-flop 402-0 outputs the pseudo random pattern sequence as the data-signal-under-measurement.

The pseudo random pattern sequence generated from the N D flip-flops 402 will be referred to as N-bit pseudo random pattern sequence hereinafter. The-N bit pseudo random pattern sequence is a signal wherein a number of data in one single pattern sequence is (2^N)−1 and which repeats such pattern. A number of data transition times in one single pattern sequence is determined by 2^(N−1) in the N-bit pseudo random pattern sequence. For example, in a pseudo random pattern sequence of three bits, a number of data in one single pattern sequence is 7 and a number of data transition times in one single pattern sequence is four. FIG. 19 shows a case when the device-under-test 400 generates the three-bit pseudo random pattern sequence and when data in one single pattern of the pseudo random pattern sequence is 0100011. Because the exclusive OR gate 404 outputs the logic value 0 when the consecutive logic values of the pseudo random pattern sequence are identical with each other and outputs the logic value 1 when the consecutive logic values are different from each other as described above, the pattern turns out to be 1100101.

The complementary data signal generating section 80 of this example has a coincidence detector 91 and a D flip-flop 92. The coincidence detector 91 is a circuit that outputs a logic value H when the signal outputted out of the exclusive OR gate 404 of the device-under-test 400 coincides with the signal outputted out of the positive output terminal Q of the D flip-flop 92. The coincidence detector 91 may be a so-called exclusive NOR.

The D flip-flop 92 takes in and outputs the signal outputted out of the coincidence detector 91 corresponding to the clock given to the device-under-test 400. The coincidence detector 91 inverts the signal outputted out of the D flip-flop 92 and inputs it to the D flip-flop 92 when the same logic value of the pseudo random pattern sequence apperas. Therefore, the signal outputted out of the D flip-flop 13 has edges at timing where the logic value of the pseudo random pattern sequence does not change. In the example shown in FIG. 19, the pattern of the complementary data signal becomes 0001001.

Such configuration allows the complementary data signal of the pseudo random pattern sequence to be readily generated. It also has a merit that the complementary data signal is already synchronized with the pseudo random pattern sequence.

Figure 20:
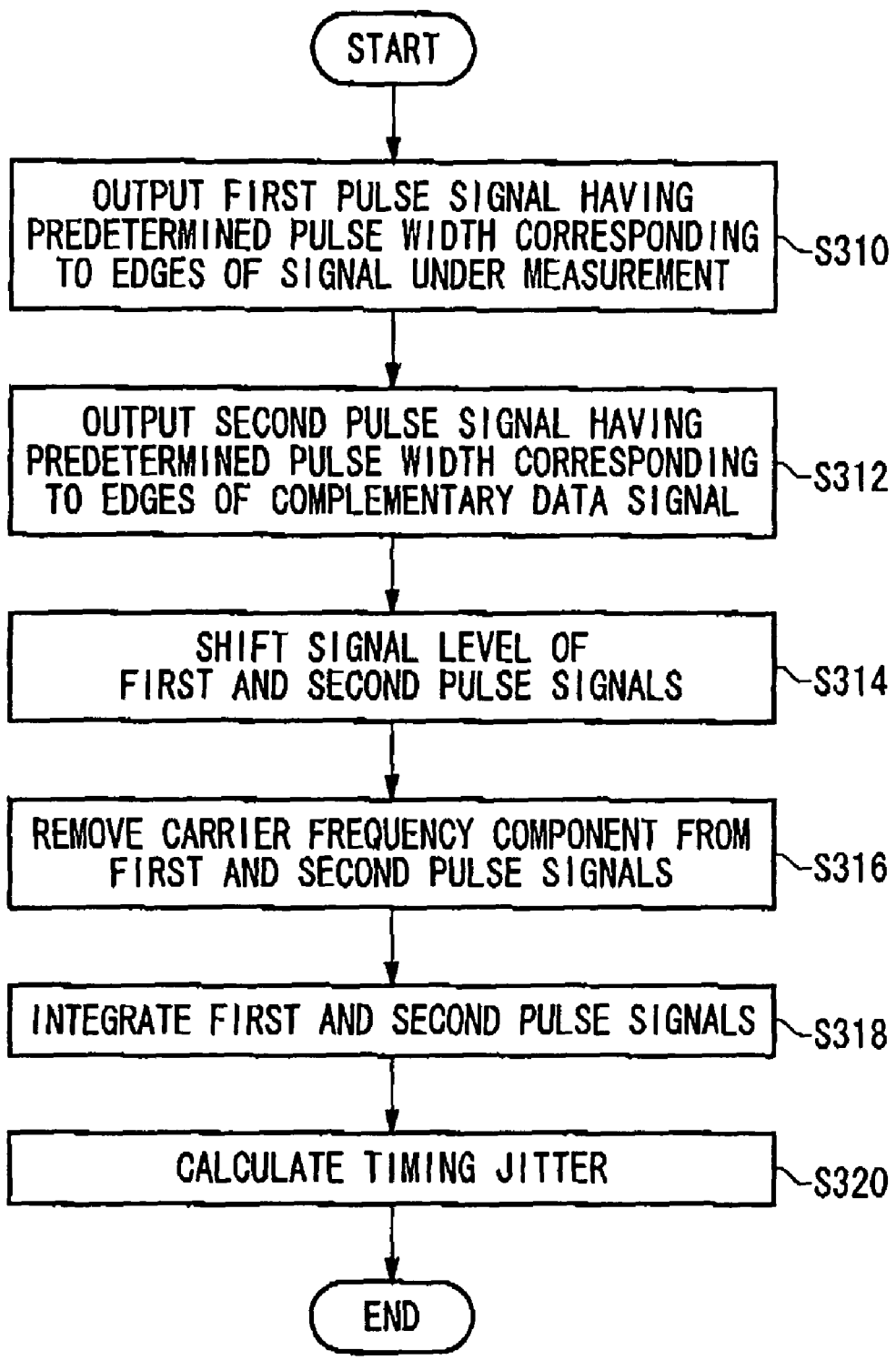
FIG. 20 is a flowchart showing one exemplary operation of the jitter measuring apparatus explained in connection with FIG. 12.

FIG. 20 is a flowchart showing one exemplary operation of the jitter measuring apparatus 40 explained in connection with FIG. 12. At first, the first pulse generator 10-1 outputs a first pulse signal having a predetermined pulse width corresponding to edges of the data-signal-under-measurement in a first pulse generating step S310. Still more, the second pulse generator 10-2 generates a second pulse signal having a predetermined pulse width corresponding to edges of the complementary data signal in a second pulse generating step S312. Here, the first and second pulse generating steps S310 and S312 may be carried out almost in the same time. Still more, in the second pulse generating step S312, the complementary data signal generating section 80 may generate the complementary data signal based on the data-signal-under-measurement as explained in connection with FIGS. 13 through 19.

Next, the first and second level shifting circuits 70-1 and 70-2 shift the signal level of the first and second pulse signals to predetermined level in a level shifting step S314.

Then, the first and second filters 60-1 and 60-2 remove the carrier frequency components of the data-signal-under-measurement from the first and second pulse signals in a filtering step S316.

Next, the integrator 20 integrates the first and second pulse signals outputted respectively from the first and second filters 60-1 and 60-2 in an integrating step S318. In the integrating step S318, the synthesizing section 90 may synthesize and output the first and second pulse signals to the integrator 20.

The jitter calculator 30 calculates jitter in the data-signal-under-measurement in a jitter calculating step S320. In the step S320, the jitter calculator 30 may calculate period jitter or timing jitter in the data-signal-under-measurement. The integrating step S318 may be omitted in calculating the period jitter. Still more, the level shifting step S314 may be set as a post-process being processed after the filtering step S316.

Figure 21:
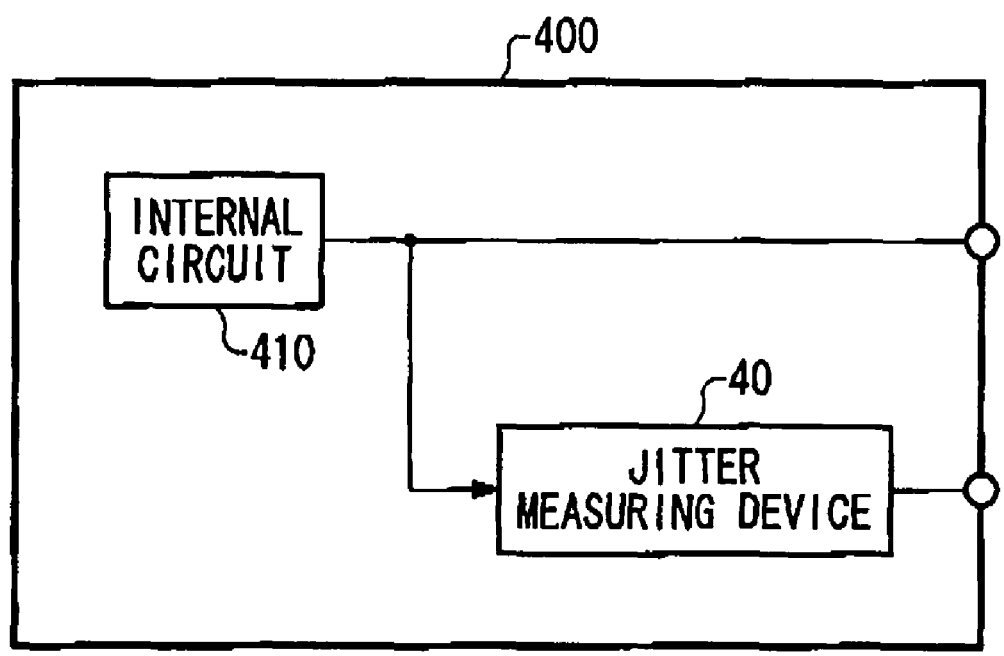
FIG. 21 is a diagram showing one exemplary configuration of the device-under-test.

FIG. 21 is a diagram showing one exemplary configuration of the device-under-measurement 400. The device-under-measurement 400 in this example is a semiconductor circuit or the like used in data communications for example and has an internal circuit 410 and a jitter measuring circuit 40.

The internal circuit 410 is a circuit that operates during when the device-under-measurement 400 operates ordinarily and outputs a clock signal, a data signal or the like to the outside. The jitter measuring circuit 40 may have the same or similar function and structure with the jitter measuring apparatus 40 explained in connection with FIGS. 4 through 20. Still more, the jitter measuring circuit 40 is not necessary to have the jitter calculator 30.

The jitter measuring circuit 40 measures the clock signal or data signal outputted out of the internal circuit 410, i.e., in-situ measurement is carried out. Still more, the jitter measuring circuit 40 may output the measured result to the outside such as a test apparatus. When the jitter measuring circuit 40 does not have the jitter calculator 30, the external test apparatus or the like may have the jitter calculator 30.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, according to the invention, the jitter component may be measured without measuring the unnecessary components such as the triangular wave component. Accordingly, the invention allows the jitter to be accurately calculated.

What is claimed is:

1. A jitter measuring apparatus, for measuring jitter in a data-signal-under-measurement, comprising:
    a first pulse generator for detecting edges of said data-signal-under-measurement to output a first pulse signal having a pulse width set in advance corresponding to said edge:
    a second pulse generator for detecting boundaries of data sections where data values do not change in said data-signal-under-measurement to output a second pulse signal having a pulse width set in advance corresponding to timing of the detected boundaries of said data sections;
    a filter for removing carrier frequency components of said data-signal-under-measurement from said first and second pulse signals; and
    a complementary data signal generating section for generating a complementary data signal having edges at every boundary of the data sections over which data values of said data-signal-under-measurement do not change and said data-signal-under-measurement has no edge,
    wherein said second pulse generator outputs said second pulse signal corresponding to the edge of said complementary data signal,
    wherein said complementary data signal generating section generates said complementary data signal by which the edges of said data-signal-under-measurement and of said complementary data signal are arranged at almost equal intervals when they are aligned in the same time axis.

2. The jitter measuring apparatus as set forth in claim 1, wherein said filter is a low pass filter that passes components having a frequency lower than a predetermined cut-off frequency which is lower than a carrier frequency of said data-signal-under-measurement among frequency components of said pulse signal.

3. The jitter measuring apparatus as set forth in claim 2, wherein said jitter calculator calculates period jitter in said data-signal-under-measurement based on a signal output from said filter.

4. The jitter measuring apparatus as set forth in claim 3, further comprising a level shifting circuit for outputting said first and second pulse signals output from said first and second pulse generators to said filter by shifting their signal level to a signal level corresponding to characteristics of said filter.

5. The jitter measuring apparatus as set forth in claim 2, further comprising an integrator for integrating the signal output from said filter.

6. The jitter measuring apparatus as set forth in claim 5, wherein said jitter calculator calculates timing jitter in said data-signal-under-measurement based on the signal obtained by integrating carried out by said integrator.

7. The jitter measuring apparatus as set forth in claim 6, further comprising a level shifting circuit for inputting the signal output from said filter to said integrator by shifting its signal level to a signal level corresponding to characteristics of said integrator.

8. A jitter measuring method for measuring jitter in a data-signal-under-measurement, comprising:
    a first pulse generating step of detecting edges of said data-signal-under-measurement to output a first pulse signal having a pulse width set in advance corresponding to said edges;
    a second pulse generating step of detecting boundaries of data sections where data values do not change in said data-signal-under-measurement to output a second pulse signal having a pulse width set in advance corresponding to timing of the detected boundary of said data sections;
    a filtering step of removing carrier frequency components of said data-signal-under-measurement from said first and second pulse signals; and
    a complementary data signal generating step of generating a complementary data signal having edges at every boundary of the data sections over which data values of said data-signal-under-measurement do not change and said data-signal-under-measurement has no edge,
    wherein said second pulse generating step comprises outputting said second pulse signal corresponding to the edge of said complementary data signal,
    wherein said complementary data signal generating step comprises generating said complementary data signal by which the edges of said data-signal-under-measurement and of said complementary data signal are arranged at almost equal intervals when they are aligned in the same time axis.

9. A test apparatus for testing a device-under-test, comprising:
    a jitter measuring apparatus for measuring jitter in a signal-under-measurement output from said device-under-test; and
    a judging section for judging whether or not said device-under-test is defect-free based on jitter in said signal-under-measurement measured by said jitter measuring apparatus,
    wherein said jitter measuring apparatus comprises:
        a first pulse generator for detecting edges of said data-signal-under-measurement and outputting a first pulse signal having a predetermined pulse width corresponding to said edge;
        a second pulse generator for detecting boundaries of data sections where data values do not change in said data-signal-under-measurement and outputting a second pulse signal having a predetermined pulse width corresponding to timing of the detected boundaries of said data sections;
        a filter for removing carrier frequency components of said data-signal-under-measurement from said first and second pulse signals;
        a complementary data signal generating section for generating a complementary data signal having edges at every boundary of the data sections over which data values of said data-signal-under-measurement do not change and said data-signal-under-measurement has no edge; and
        a jitter calculating section for calculating timing jitter in said data-signal under-measurement based on said first and second pulse signals
    wherein said second pulse generator outputs said second pulse signal corresponding to the edge of said complementary data signal,
    wherein said complementary data signal generating section generates said complementary data signal by which the edges of said data-signal-under-measurement and of said complementary data signal are arranged at almost equal intervals when they are aligned in the same time axis.

10. An electronic device, comprising an internal circuit for outputting a data signal and a jitter measuring circuit for measuring jitter in the data signal output from said internal circuit, said jitter measuring circuit comprising:

a first pulse generator for detecting edges of said data signal to output a first pulse signal having a predetermined pulse width corresponding to said edge;

a second pulse generator for detecting boundaries of data sections where data values do not change in said data signal to output a second pulse signal having a predetermined pulse width corresponding to timing of the detected boundaries of said data sections;

a filter for removing carrier frequency components of said data signal from said first and second pulse signals; and a complementary data signal generating section for generating a complementary data signal having edges at every boundary of the data sections over which data values of said data-signal-under-measurement do not change and said data-signal-under-measurement has no edge, wherein said second pulse generator outputs said second pulse signal corresponding to the edge of said complementary data signal, wherein said complementary data signal generating section generates said complementary data signal by which the edges of said data-signal-under-measurement and of said complementary data signal are arranged at almost equal intervals when they are aligned in the same time axis.

11. The electronic device as set forth in claim 10, wherein said jitter measuring circuit further has a jitter calculator for calculating timing jitter in said data based on the signal outputted out of said filter.

12. The jitter measuring apparatus as set forth in claim 1, further comprising a jitter calculator for calculating timing jitter in said data-signal-under-measurement based on said signals outputted out of said filter.

13. The jitter measuring apparatus as set forth in claim 8, further comprising a jitter calculating step of calculating timing jitter in said data-signal-under-measurement based on said pulse signals output in said filtering step.

* * * * *